(12) United States Patent
Lu et al.

(10) Patent No.: US 12,342,564 B2
(45) Date of Patent: Jun. 24, 2025

(54) SEMICONDUCTOR STRUCTURE AND FORMING METHOD THEREOF

(71) Applicant: TAIWAN SEMICONDUCTOR MANUFACTURING COMPANY LTD., Hsinchu (TW)

(72) Inventors: Hsueh-Han Lu, Tainan (TW); Kun-Ei Chen, Tainan County (TW); Chen-Chieh Chiang, Kaohsiung (TW); Ling-Sung Wang, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 625 days.

(21) Appl. No.: 17/697,575

(22) Filed: Mar. 17, 2022

(65) Prior Publication Data
US 2023/0299179 A1    Sep. 21, 2023

(51) Int. Cl.
| | | |
|---|---|---|
| *H01L 21/02* | (2006.01) | |
| *H10D 30/01* | (2025.01) | |
| *H10D 30/62* | (2025.01) | |
| *H10D 84/01* | (2025.01) | |
| *H10D 84/03* | (2025.01) | |

(52) U.S. Cl.
CPC ....... *H10D 30/024* (2025.01); *H01L 21/0223* (2013.01); *H01L 21/0228* (2013.01); *H10D 30/6211* (2025.01); *H10D 84/0151* (2025.01); *H10D 84/0158* (2025.01); *H10D 84/038* (2025.01)

(58) Field of Classification Search
CPC .......... H01L 29/66795; H01L 21/0223; H01L 21/0228; H01L 21/823431; H01L 21/823481; H01L 29/7851; H01L 21/02238; H01L 21/02247; H01L 21/02326; H01L 21/3065; H01L 21/32; H01L 21/76224; H01L 27/0886
USPC ....................................................... 257/288
See application file for complete search history.

(56) References Cited

U.S. PATENT DOCUMENTS

| | | | |
|---|---|---|---|
| 8,513,131 B2* | 8/2013 | Cai | H01L 27/0886 257/E21.018 |
| 9,287,402 B2* | 3/2016 | Oh | H01L 21/302 |
| 9,536,795 B2* | 1/2017 | Balakrishnan | H01L 21/02164 |
| 9,786,563 B2* | 10/2017 | Basker | H01L 21/3065 |
| 9,847,331 B2* | 12/2017 | Tsao | H01L 21/823431 |
| 9,865,597 B2* | 1/2018 | Cha | H01L 21/823821 |
| 9,972,621 B1* | 5/2018 | Wu | H01L 29/7851 |
| 9,984,937 B1* | 5/2018 | Bi | H01L 29/7827 |
| 10,475,791 B1* | 11/2019 | Zang | H01L 29/7853 |
| 10,535,570 B1* | 1/2020 | Ando | H01L 21/324 |
| 10,692,769 B2* | 6/2020 | Liang | H01L 29/1037 |
| 10,847,426 B2* | 11/2020 | Wang | H01L 21/823807 |

(Continued)

*Primary Examiner* — Vu A Vu
(74) *Attorney, Agent, or Firm* — WPAT LAW; Anthony King

(57) ABSTRACT

A semiconductor structure and a method are provided. The method includes patterning a substrate to form a first fin structure in a first region and a second fin structure in a second region, wherein a first width of the first fin structure is greater than a second width of the second fin structure; forming a protecting layer on the second fin structure; and forming a first oxide layer over the first fin structure and forming a second oxide layer over the protecting layer, wherein a width of the first oxide layer is greater than a width of the second oxide layer.

20 Claims, 29 Drawing Sheets

(56) References Cited

U.S. PATENT DOCUMENTS

| | | | |
|---|---|---|---|
| 11,018,254 B2* | 5/2021 | Balakrishnan | H01L 21/02381 |
| 11,488,954 B2* | 11/2022 | Dentoni Litta | H01L 21/467 |
| 11,581,190 B2* | 2/2023 | Cheng | H01L 21/426 |
| 2020/0043806 A1* | 2/2020 | Hung | H01L 21/823821 |
| 2021/0111272 A1* | 4/2021 | Wu | H01L 21/823431 |

* cited by examiner

SEMICONDUCTOR STRUCTURE AND FORMING METHOD THEREOF

BACKGROUND

Electronic equipment involving semiconductor devices is essential for many modern applications. Technological advances in materials and design have produced generations of semiconductor devices where each generation has smaller and more complex circuits than the previous generation. As semiconductor technologies further advance, fin field-effect transistors (FinFETs) have emerged as an effective alternative to further reduce the physical size of a semiconductor device. Although existing FinFET devices and methods of fabricating FinFET devices have generally been adequate for their intended purpose, they have not been entirely satisfactory in all aspects.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
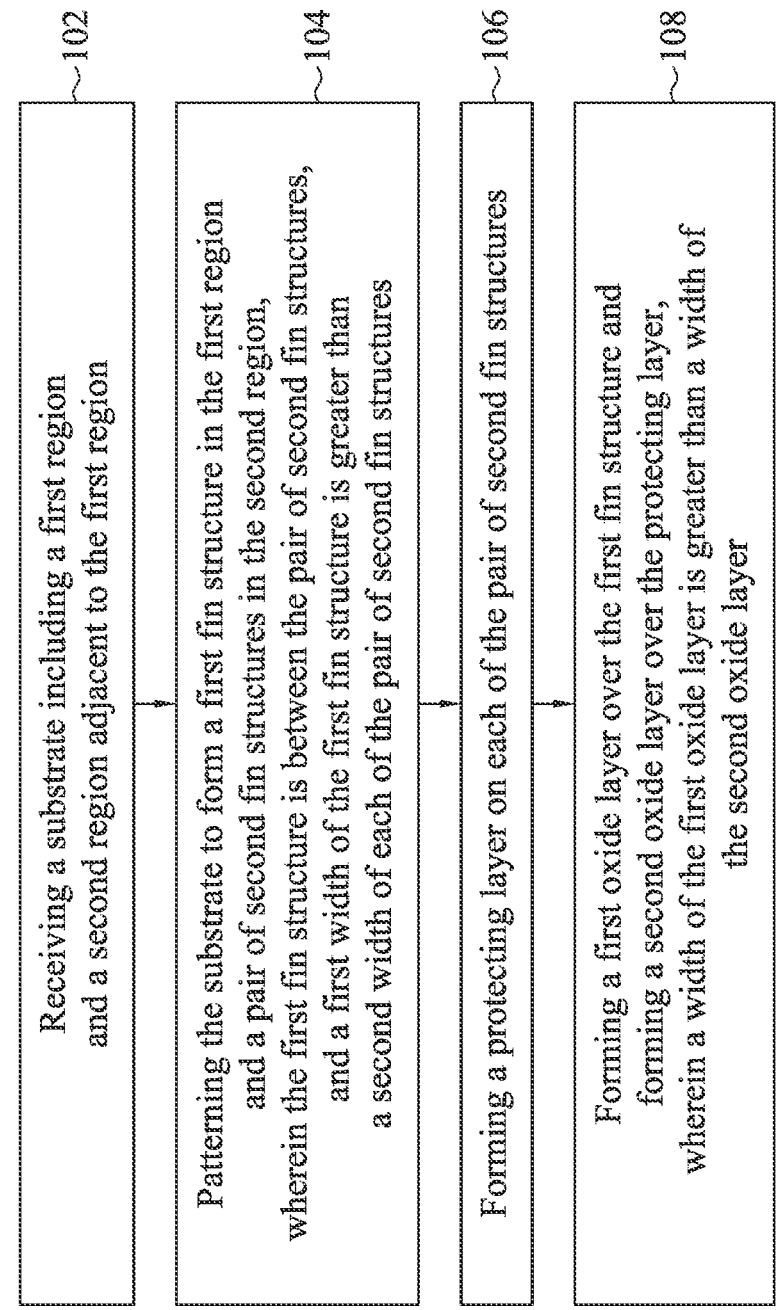
FIG. 1 is a flowchart representing a method according to aspects of one or more embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be appreciated that the following figures are not drawn to scale; rather, these figures are merely intended for illustration.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" or "about" generally mean within a value or range that can be contemplated by people having ordinary skill in the art. Alternatively, the terms "substantially," "approximately" or "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

With the increasing down-scaling of integrated circuits and the increasingly demanding requirements to the speed of integrated circuits, transistors need to have higher drive currents with increasingly smaller dimensions. Fin Field-Effect Transistors (FinFETs) were thus developed. The FinFETs include vertical semiconductor fins on a substrate. The semiconductor fins are used to form source/drain regions and channel regions between the source/drain regions. Due to the high density and the high aspect ratio of the fins, the formations of the semiconductor fins face several problems. For example, the pattern loading effect may result in the profiles and the widths of the semiconductor fins to vary significantly from fin to fin, resulting in a performance variation in FinFETs.

Some embodiments of the present disclosure provide a semiconductor structure and a forming method thereof. The proposed method provides advantages. The difference in fin widths due to pattern loading effect is reduced by selectively forming a protecting layer on the fin structures in different areas of the substrate. The presence of the protecting layer may affect oxidation rates in a predictable amount to offset the pattern loading effect. Accordingly, the variation of fin widths of the resulting fin structures may be reduced and the performance variation in FinFETs may be addressed.

FIG. 1 is a flowchart representing a method 100 according to aspects of one or more embodiments of the present disclosure. The method 100 includes an operation 102, in which a substrate is received. In some embodiments, the substrate includes a first region and a second region adjacent to the first region. The method 100 further includes an operation 104, in which the substrate is patterned to form a first fin structure in the first region and a pair of second fin structures in the second region. In some embodiments, the first fin structure is between the pair of second fin structures. In some embodiments, a first width of the first fin structure is greater than a second width of each of the pair of second fin structures. The method 100 further includes an operation 106, in which a protecting layer is formed on each of the pair of second fin structures. The method 100 further includes an operation 108, in which a first oxide layer is formed over the first fin structure and a second oxide layer is formed over the protecting layer. In some embodiments, a width of the first oxide layer is greater than a width of the second oxide layer.

Figure 2:
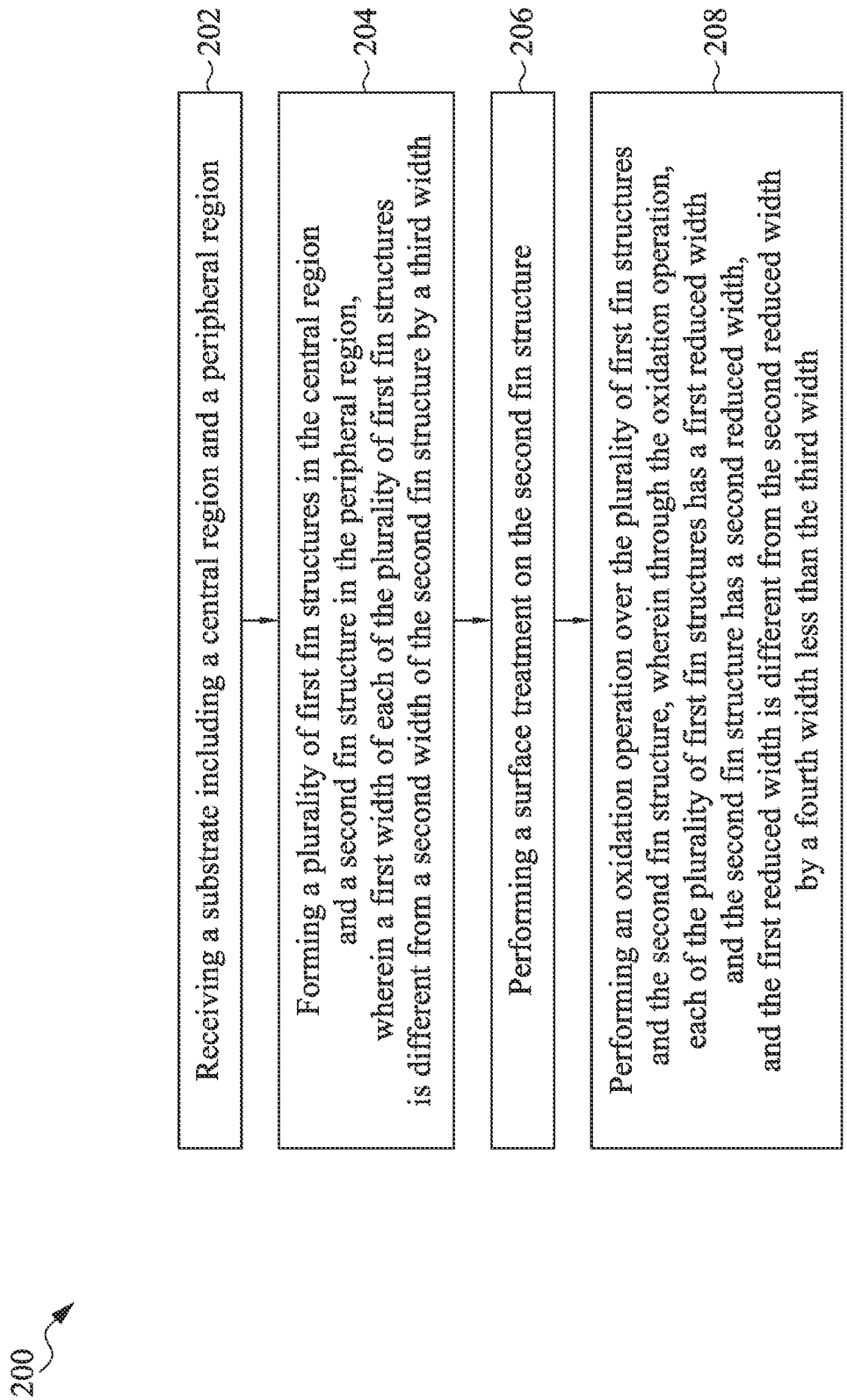
FIG. 2 is a flowchart representing a method according to aspects of one or more embodiments of the present disclosure.

FIG. 2 is a flowchart representing a method 200 according to aspects of one or more embodiments of the present disclosure. The method 200 includes an operation 202, in which a substrate is received. In some embodiments, the substrate includes a central region and a peripheral region. The method 200 further includes an operation 204, in which a plurality of first fin structures is formed in the central region and a second fin structure is formed in the peripheral region. In some embodiments, a first width of each of the plurality of first fin structures is different from a second width of the second fin structure by a third width. The method 200 further includes an operation 206, in which a surface treatment is performed on the second fin structure. The method 200 further includes an operation 208, in which an oxidation operation is performed over the plurality of first fin structures and the second fin structure. In some embodiments, through the oxidation operation, each of the plurality of first fin structures has a first reduced width and the second fin structure has a second reduced width. In some embodiments, the first reduced width is different from the second reduced width by a fourth width less than the third width.

As used herein, the term "fin structure" recited throughout the description is defined as a fin encompassing only the semiconductor part. In other words, oxide layers and/or protecting layers formed on the semiconductor part of the fin, e.g., through deposition or surface treatment, are not considered as part of the "fin structure."

The methods 100 and 200 are described for a purpose of illustrating concepts of the present disclosure and the description is not intended to limit the spirit of the present disclosure to only what is explicitly recited in the claims. Additional operations can be provided before, during, and after the methods illustrated above and in FIG. 1 and/or FIG. 2, and some operations described can be replaced, eliminated, or moved around for additional embodiments of the methods.

FIGS. 3 to 15C are cross-sectional views illustrating a semiconductor structure at different fabrication stages constructed according to aspects of one or more embodiments of the present disclosure. FIGS. 16 to 17 are schematic drawings illustrating a semiconductor structure at different fabrication stages constructed according to aspects of the present disclosure in one or more embodiments.

Figure 3:
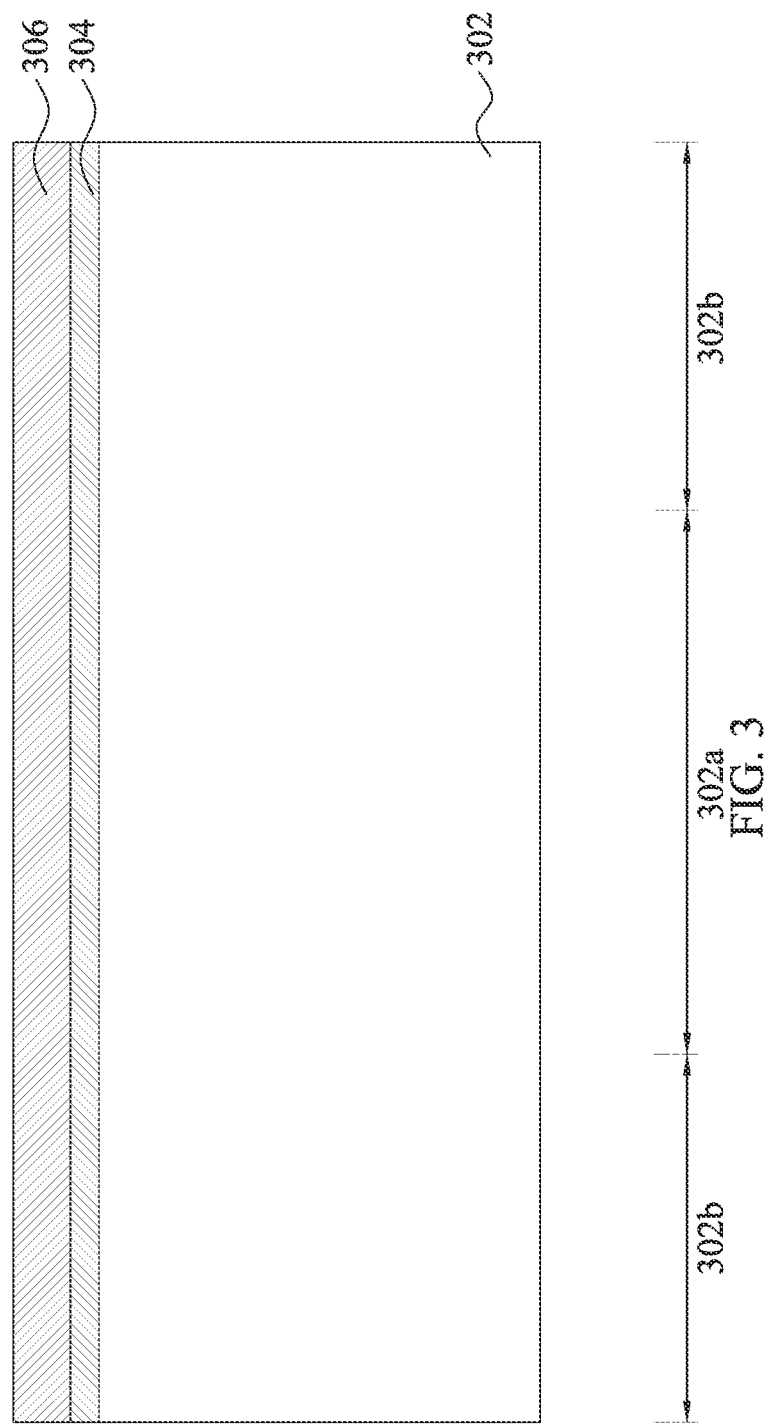
FIGS. 3 to 15C are cross-sectional views illustrating a semiconductor structure at different fabrication stages constructed according to aspects of one or more embodiments of the present disclosure.

Referring to FIG. 3, a substrate 302 is received or formed. The respective step is shown as operation 102 of the method 100 in FIG. 1 or operation 202 of the method 200 in FIG. 2. The substrate 302 may be a semiconductor wafer such as a silicon wafer. The substrate 302 may include elementary semiconductor materials, compound semiconductor materials, or alloy semiconductor materials. Examples of elementary semiconductor materials may be, for example but not limited thereto, single crystal silicon, polysilicon, amorphous silicon, and/or germanium (Ge). Examples of compound semiconductor materials may be, for example but not limited thereto, silicon carbide (SiC), gallium arsenic (GaAs), gallium phosphide (GaP), indium phosphide (InP), indium arsenide (InAs), and/or indium antimonide (InSb). Examples of alloy semiconductor material may be, for example but not limited thereto, SiGe, GaAsP, AlGaAs, GaInAs, GaInP, and/or GaInAsP. In alternative embodiments, the substrate 302 may be a multi-layered substrate, a gradient substrate, or a hybrid orientation substrate.

The substrate 302 may include one or more first regions 302a and one or more second regions 302b. The second region 302b may be adjacent to the first region 302a. The first region 302a may be regarded as a central region of the substrate 302, while the second region 302b may be regarded as a peripheral region of the substrate 302. In some embodiments, the first region 302a is laterally surrounded by the second region 302b. In alternative embodiments, at least one of the first regions 302a is disposed between two opposite second regions 302b.

A pad layer 304 and a mask layer 306 are formed on the substrate 302. The pad layer 304 may be a thin film comprising silicon oxide formed, for example, using a thermal oxidation process. The pad layer 304 may act as an adhesion layer between the substrate 302 and the mask layer 306. The pad layer 304 may also act as an etch stop layer for etching the mask layer 306. In some embodiments, the mask layer 306 is formed of silicon nitride, for example, using low-pressure chemical vapor deposition (LPCVD). In alternative embodiments, the mask layer 306 is formed by thermal nitridation of silicon, plasma-enhanced chemical vapor deposition (PECVD), or plasma anodic nitridation. The mask layer 306 may be used as a hard mask during subsequent photolithography processes. In alternative embodiments, additional layers such as an amorphous carbon layer, an oxide layer, or multi-layers thereof, may be formed over mask layer 306.

Figure 4:
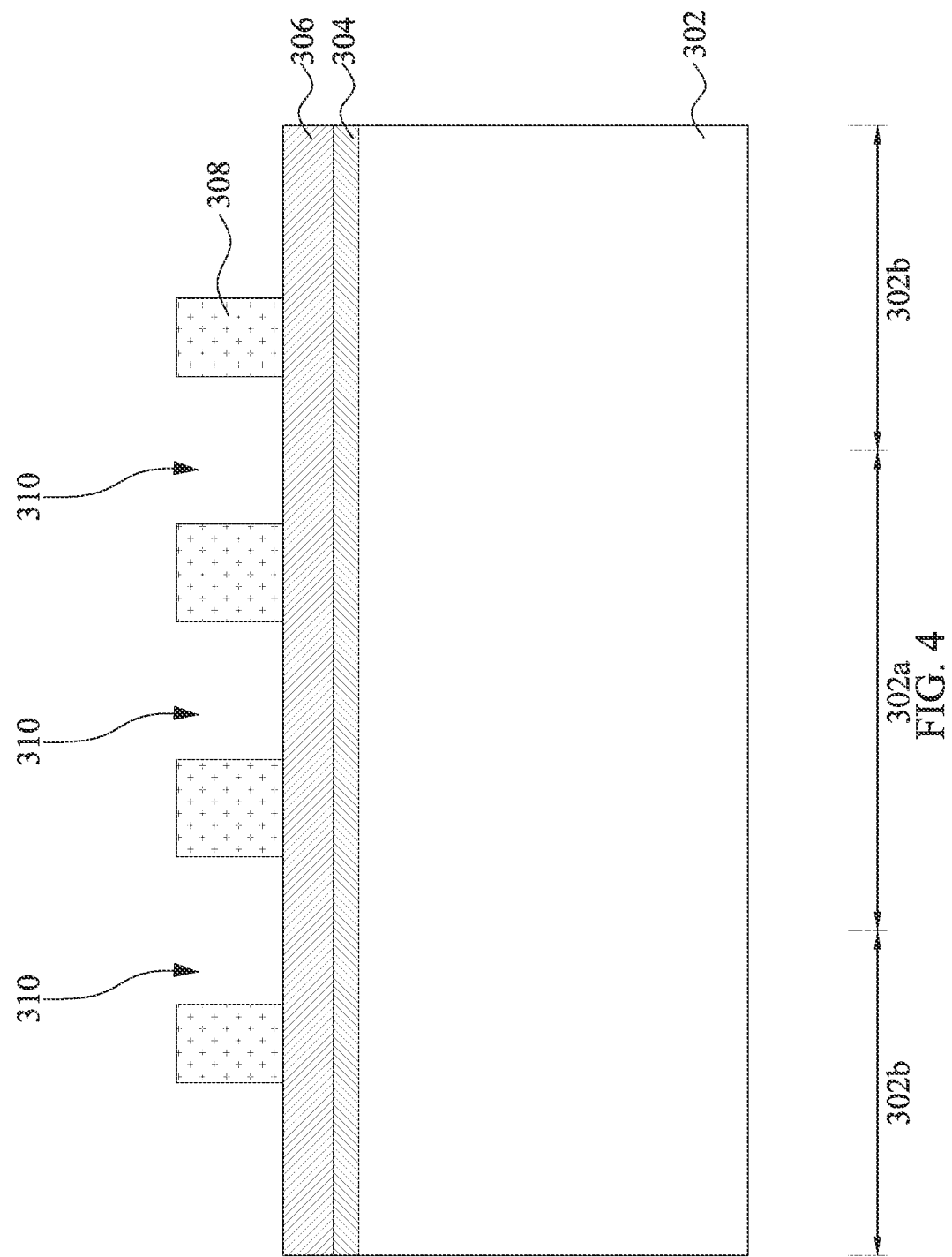
Figure 5:
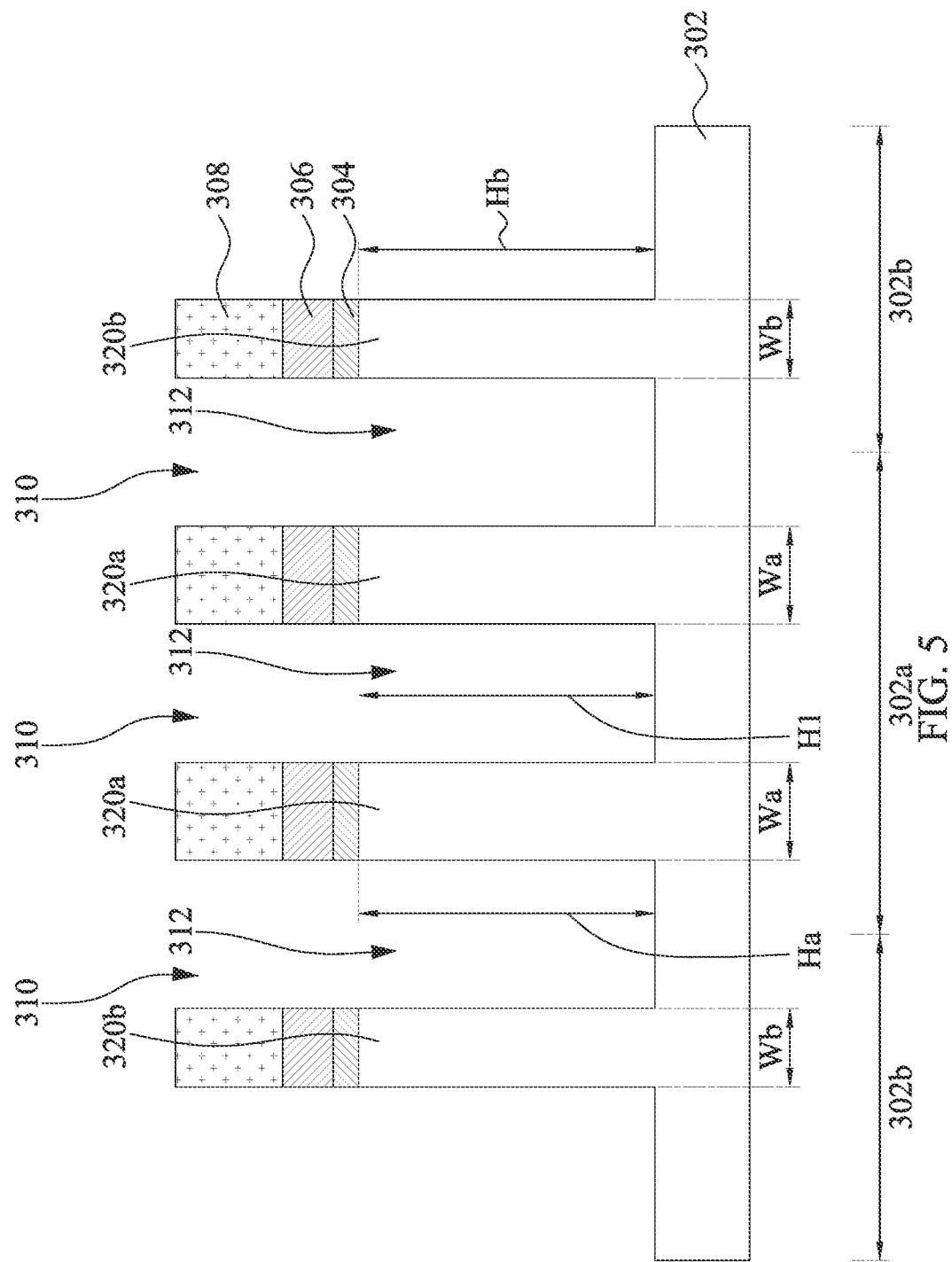
Figure 6:
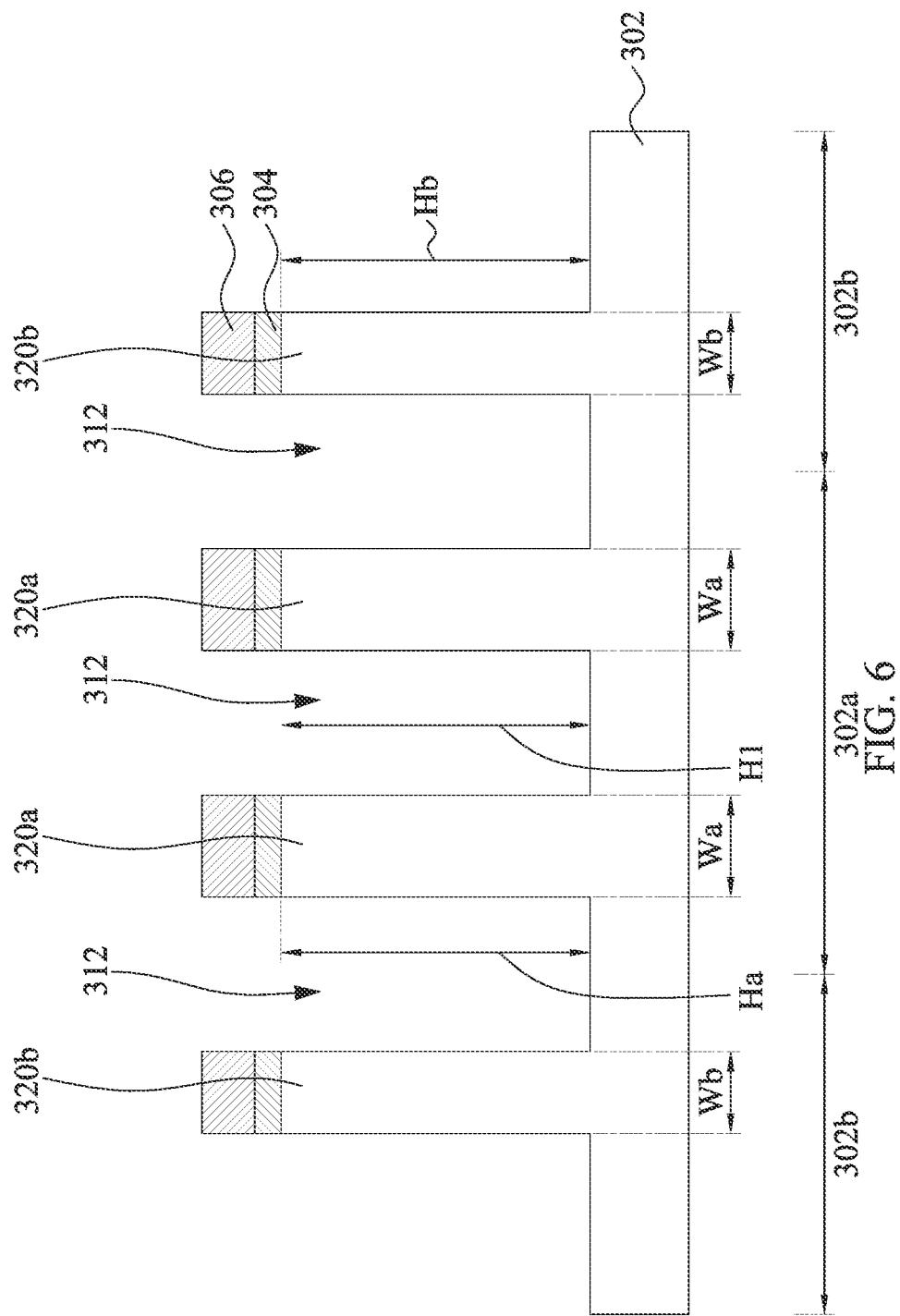

FIGS. 4 to 6 illustrate the formation of one or more fin structures 320a and 320b. The respective step is shown as operation 104 of the method 100 in FIG. 1 or operation 204 of the method 200 in FIG. 2.

Referring to FIG. 4, a patterned mask 308 is formed over the mask layer 306. The patterned mask 308 may include one or more openings 310 exposing the underlying mask layer 306. In some embodiments, the patterned mask 308 is formed of a photoresist material. In alternative embodiments, the patterned mask 308 is formed of other dielectric materials such as oxide, which may be formed using, for example, a self-aligned double patterning process.

Referring to FIG. 5, the mask layer 306 and the pad layer 304 are etched through the openings 310 of the patterned mask 308, exposing the underlying substrate 302. The exposed substrate 302 is then patterned to form trenches 312. In some embodiments, the exposed substrate 302 is patterned by an etching operation. The trenches 312 may be strips (when viewed in the top view of the substrate 302) that are parallel to each other. The portions of the substrate 302 between neighboring trenches 312 form one or more fin structures 320a in the first region 302a and one or more fin structures 320b in the second region 302b. The fin structures 320a and 320b may be semiconductor strips. The etching operation in FIG. 5 may be referred to as a fin etch operation. The sizes and positions of the fin structures 320a and 320b are defined by this operation. In some embodiments, the etching of substrate 302 is performed using, for example, a dry etching operation.

For regions with different exposed areas (or etched areas), it is difficult to control etching uniformity due to the loading effect. Depending on the integration of fin structures and etching strategy, the loading effect is the etching rate for a larger exposed area being either faster or slower than it is for a smaller exposed area. In other words, the loading effect is that the etching rate in peripheral area (e.g., the second region 302b) mismatches the etching rate in center area (e.g., the first region 302a). This means that the loading effect may be affected by the pattern density. Therefore, while etching the fin structures 320a and 320b in different regions 302a and 302b, it is more difficult to control the uniformity of the etched widths.

In some embodiments, a width Wa of the fin structure 320a in the first region 302a is greater than a width Wb of the fin structure 320b in the second region 302b. The width Wa of the fin structure 320a may be between about 10 angstrom (Å) and about 1000 Å, and the width Wb of the fin structure 320b may be between about 10 Å and about 1000 Å. In some embodiments, a difference between the width Wa and the width Wb is in a range from about 10 Å to about 500 Å. A depth D1 may be substantially equal to a height Ha of the fin structure 320a and a height Hb of the fin structure 320b. The depth D1 of the trenches 312, the height Ha of the fin structure 320a, and the height Hb of the fin structure 320b may be between about 100 Å and about 10000 Å. It is appreciated, however, that the values recited throughout the description are merely examples, and may be changed to different values.

Referring to FIG. 6, the patterned mask 308 is removed. In some embodiments, a cleaning operation is performed to clean the surfaces of substrate 302 and the surfaces of the fin structures 320a and 320b. The cleaning operation may be performed using diluted hydrofluoric (HF) acid, for example.

Figure 7:
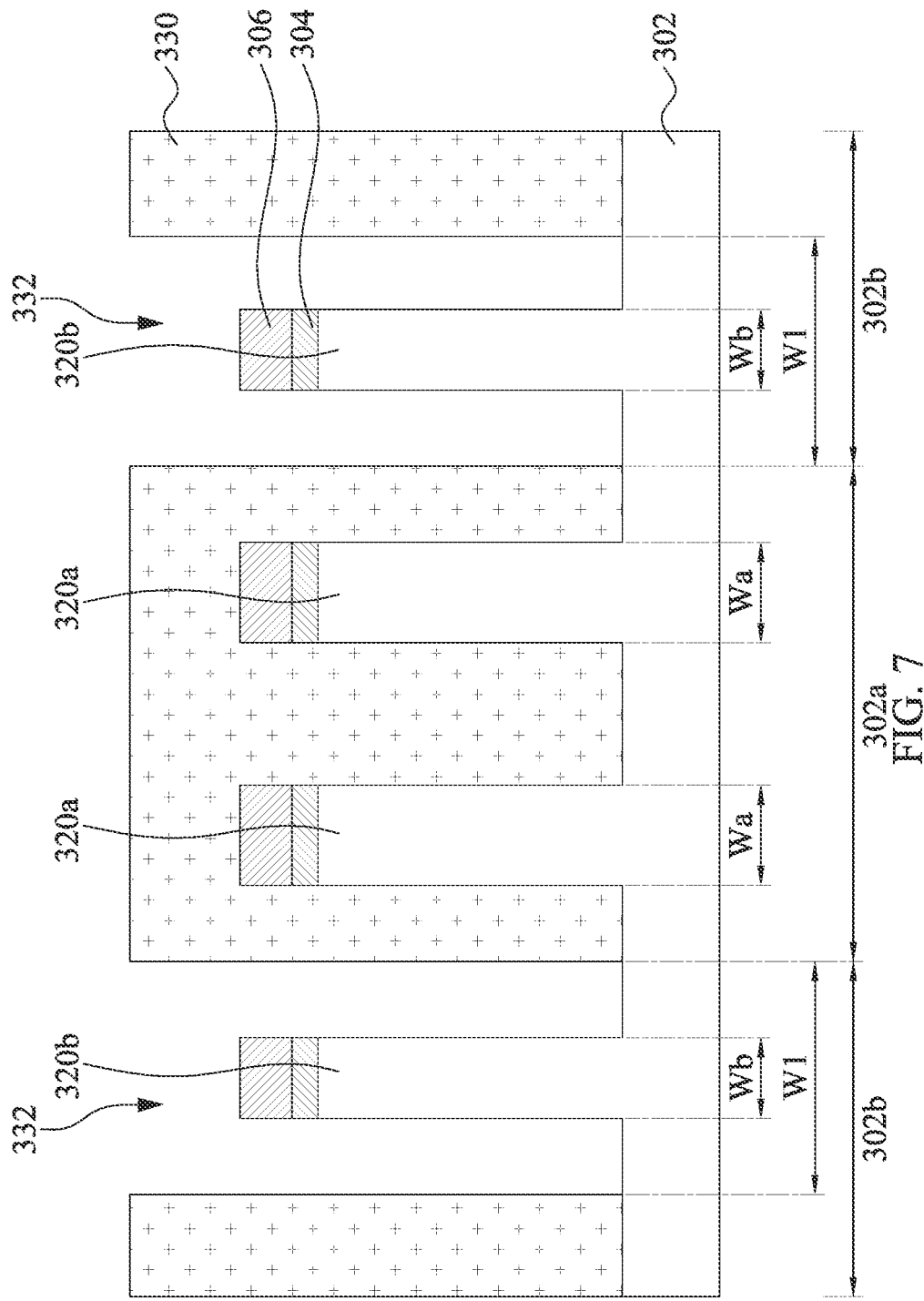

Referring to FIG. 7, a patterned mask 330 is formed over the substrate 302. The patterned mask 330 may be formed by a photolithography patterning operation. In some embodiments, the patterned mask 330 is formed of a photoresist material. The photolithography patterning operation may include depositing the photoresist material, exposing according to a desired pattern, and developing. The patterned mask 330 may include one or more openings 332 exposing the fin structures 320b in the second region 302b. In some embodiments, a width W1 of the opening 332 is greater than the width Wb of the fin structure 320b. The patterned mask 330 may cover the fin structures 320a in the first region 302a. In some embodiments, the patterned mask 330 partially covers the surface of the substrate 302 in the second region 302b.

Figure 8:
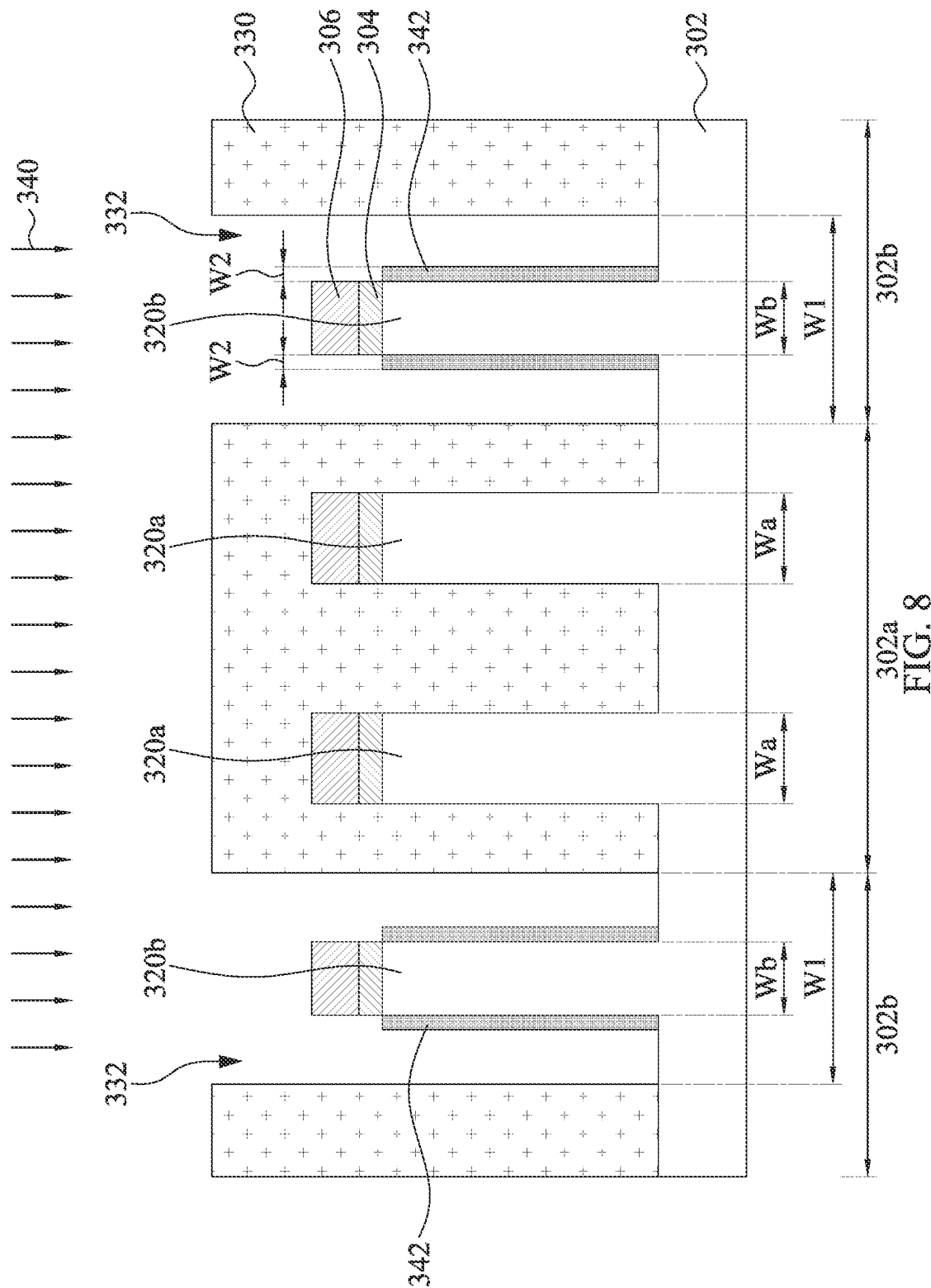

Referring to FIG. 8, a protecting layer 342 is formed on the fin structure 320b. In some embodiments, the protecting layer 342 is formed on the fin structure 320b by a surface treatment 340. The surface treatment 340 may be performed on the fin structure 320b. The respective step is shown as operation 106 of the method 100 in FIG. 1 or operation 206 of the method 200 in FIG. 2. The surface treatment 340 may include nitridation on the exposed surface of the fin structure 320b in the second region 302b. For example, the surface treatment 340 may include implantation with nitrogen (N). A chemical formula of the protecting layer 342 may be $Si_xN_y$, wherein x and y are integers greater than zero. In alternative embodiments, the surface treatment 340 include implantation with boron (B), carbon (C), phosphorus (P), gallium (Ga), germanium (Ge), arsenic (As), indium (In), and/or antimony (Sb). Alternatively, the surface treatment 340 may include implantation with $Ge_xN_y$, wherein x and y are integers greater than zero. In some embodiments, the protecting layer 342 includes at least 1% atomic concentration of the implantation material. The atomic concentration of the implantation material may be between about 1% and about 50%. In other embodiments, the protecting layer 342 is formed by thermal diffusion, atomic layer deposition, or wet diffusion. In some embodiments, the wet diffusion includes a solution including the diffusion materials, such as boron (B), carbon (C), phosphorus (P), gallium (Ga), germanium (Ge), arsenic (As), indium (In), and/or antimony (Sb). The solution of the wet diffusion may include $H_2SO_4$, HF, $NH_4OH$, HCl, and/or $H_2O_2$. In alternative embodiments, a cleaning operation is performed prior to the implantation, thermal diffusion, atomic layer deposition, or wet diffusion.

In some embodiments, the protecting layer 342 is conformal to the fin structure 320b. The protecting layer 342 may be formed to cover the exposed surface of the fin structure 320b in the second region 302b. In some embodiments, the exposed surface of the fin structure 320b is entirely covered by the protecting layer 342. A sufficiently great width W2 (or thickness) of the protecting layer 342 is determined such that the protecting layer 342 is able to at least partially block the oxygen atoms from reaching the fin structure 320b during subsequent oxidation operations. Detailed functions of the protecting layer 342 are discussed later with reference to FIG. 10A. In some embodiments, the width W2 of the protecting layer 342 is between about 1 Å and about 30 Å.

Figure 9:
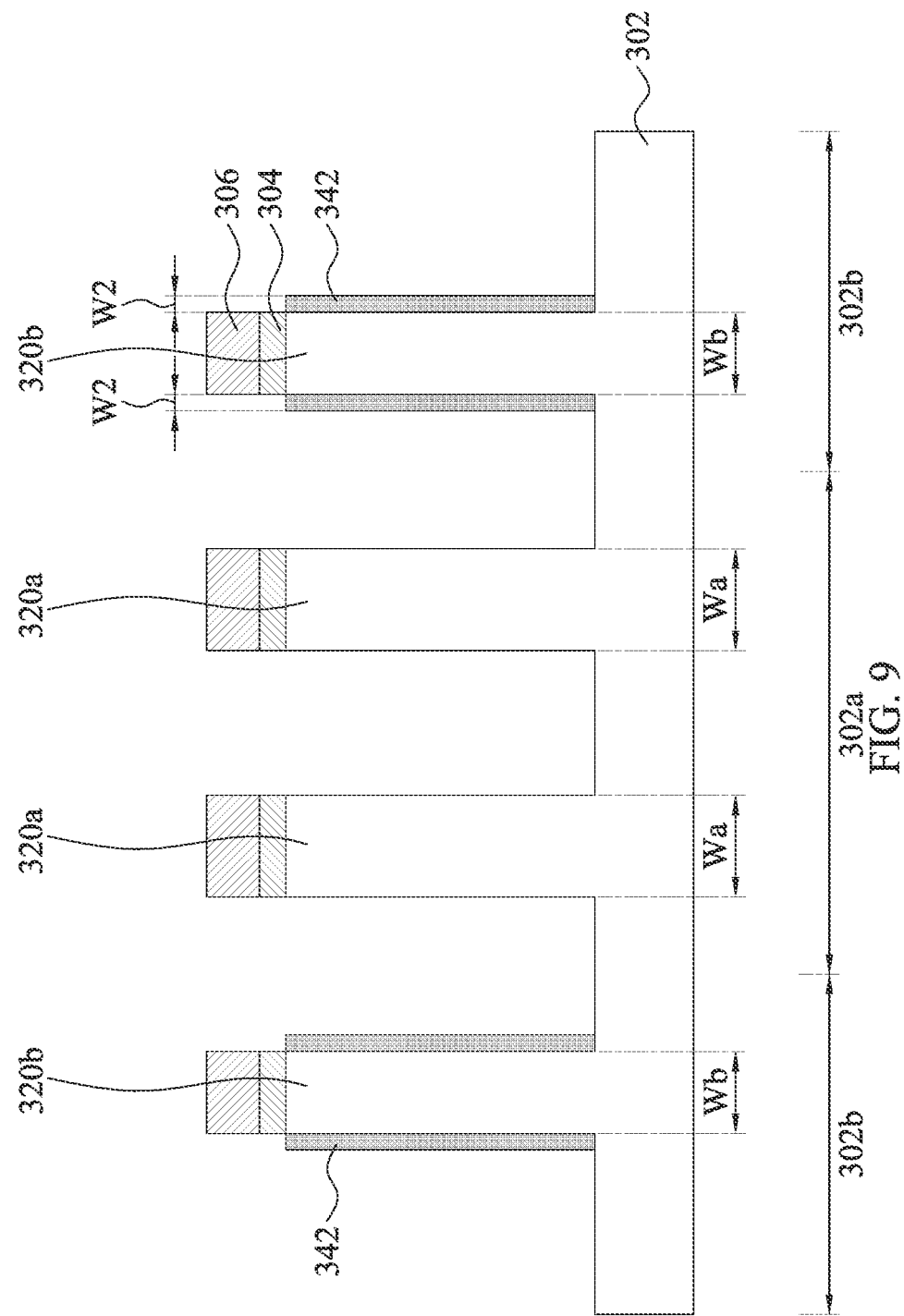

Referring to FIG. 9, the patterned mask 330 is removed after the formation of the protecting layer 342. Due to the presence of the patterned mask 330, the protecting layer 342 is formed on the fin structures 320b in the second region 302b only, while the fin structure 320a in the first region 302a is free of the protecting layer 342. In other words, the surfaces of the fin structures 320a in the first region 302a are exposed, while the surfaces of the fin structures 320b in the second region 302b are covered by the protecting layer 342.

Figure 10A:
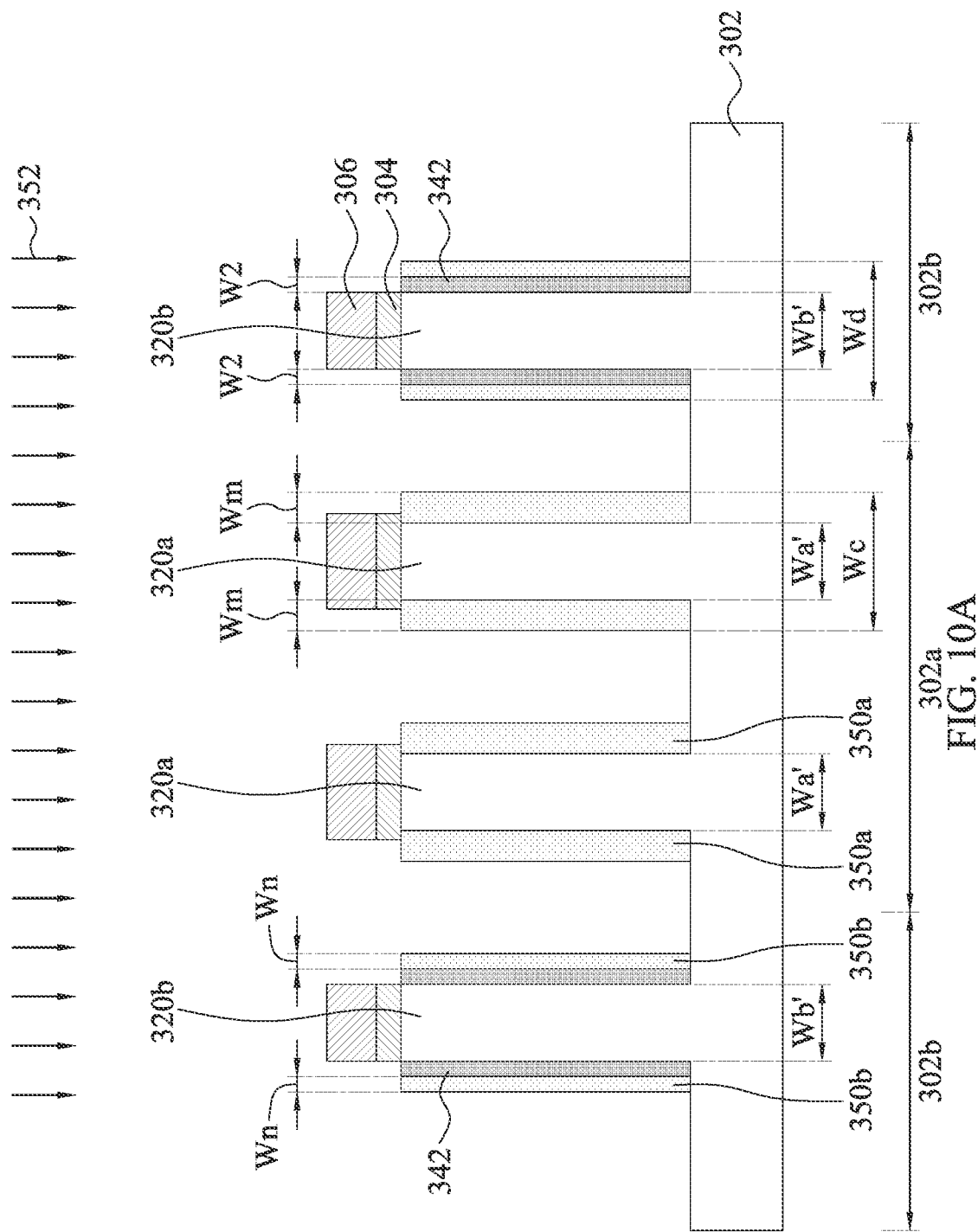
Figure 10B:
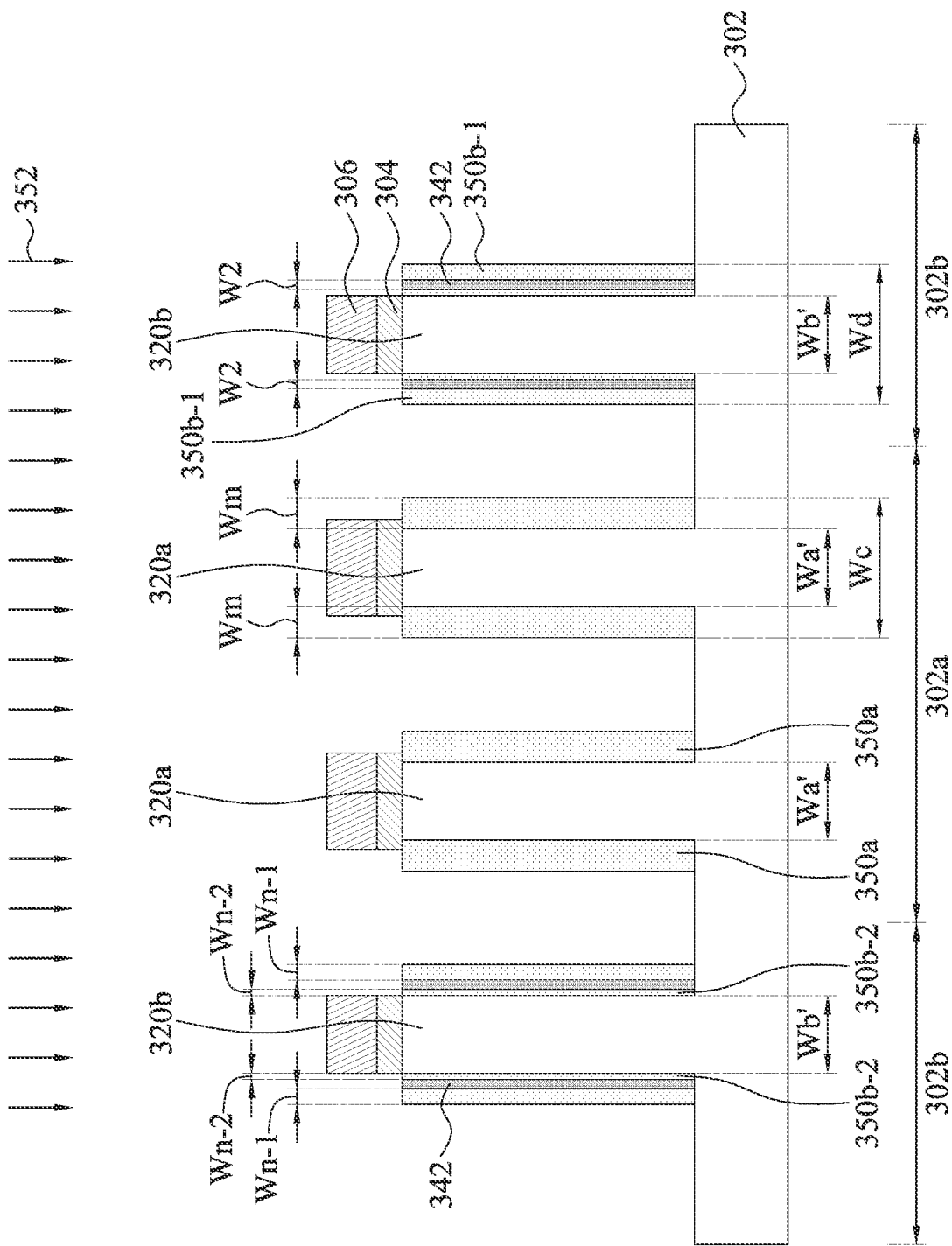

FIGS. 10A to 10B illustrate different embodiments of the formation of oxide layers. The respective step is shown as operation 108 of the method 100 in FIG. 1 or operation 208 of the method 200 in FIG. 2.

Referring to FIG. 10A, an oxide layer 350a is formed over the fin structure 320a in the first region 302a, and an oxide layer 350b is formed over the fin structure 320b in the second region 302b. In some embodiments, the oxide layers 350a and 350b are formed by performing an oxidation operation 352 over the fin structures 320a and 320b. The oxidation operation 352 may introduce oxygen atoms toward the fin structures 320a and 320b. The oxygen atoms may react with the atoms in the fin structures 320a and/or 320b, forming the oxide layers 350a and 350b. The oxide layers 350a and 350b may be regarded as a liner oxide. The liner oxide may be a thermal oxide. A chemical formula of the oxide layers 350a and 350b may be $Si_xO_y$, wherein x and y are integers greater than zero.

In the first region 302a, the oxide layer 350a is formed on the exposed surface of the fin structure 320a. In the second region 302b, due to the presence of the protecting layer 342, the oxide layer 350b is formed on the protecting layer 342. The protecting layer 342 may be configured as an oxygen blocking layer. For example, the protecting layer 342 at least partially blocks the oxygen atoms from reaching the fin structures 320b in the second region 302b. In some embodiments, the oxygen atoms enter the protecting layer 342 and are partially trapped in the protecting layer 342. After the oxidation operation 352, a chemical formula of the protecting layer 342 may be changed to be $Si_xO_yN_z$, wherein x, y and z are integers greater than zero. In some embodiments, the oxide layer 350b is separated from the fin structure 320b by the protecting layer 342.

Since the surfaces of the fin structures 320a in the first region 302a are exposed, the oxygen atoms may freely react with the atoms (e.g., silicon atoms) in the fin structures 320a. The fin structure 320a may have a shrinkage profile after the oxidation operation 352 since at least some of the atoms in the fin structure 320a react with the oxygen atoms and form the oxide layer 350a. As used herein, the term "fin structure 320a" are defined as encompassing only the semiconductor fin. In other words, the oxide layer 350a is not considered as part of the "fin structure 320a." Hence, the fin structure 320a may have a reduced width Wa' after the oxidation operation 352. The reduced width Wa' is different from the original width Wa of the fin structure 320a. The reduced width Wa' is less than the width Wa.

Since the sidewall surfaces of the fin structures 320b in the second region 302b are covered by the protecting layer 342, the oxygen atoms may be at least partially blocked by the protecting layer 342. The fin structure 320b may have a shrinkage profile after the oxidation operation 352 since at least some of the atoms in the fin structure 320b react with the oxygen atoms and form the oxide layer 350b. As used herein, the term "fin structure 320b" are defined as encompassing only the semiconductor fin. In other words, the oxide layer 350b and the protecting layer 342 are not considered as part of the "fin structure 320b." In some embodiments, the fin structure 320b has a reduced width Wb' after the oxidation operation 352. In some embodiments, the difference between the reduced width Wb' and the original width Wb could be negligible. In some embodiments, the reduced width Wb' substantially equals the original width Wb of the fin structure 320b.

Since a greater number of the oxygen atoms react with the fin structure 320a while a smaller number of the oxygen atoms react with the fin structure 320b, a width Wm of the oxide layer 350a may be greater than a width Wn of the oxide layer 350b. In some embodiments, a difference between the width Wm and the width Wn substantially equals the width W2 of the protecting layer 342. In some embodiments, an overall width We of the fin structure 320a and the oxide layer 350a substantially equals an overall width Wd of the fin structure 320b, the protecting layer 342 and the oxide layer 350b.

In some embodiments, the reduced width Wa' of the fin structure 320a substantially equals the reduced width Wb' of the fin structure 320b. In some embodiments, the reduced width Wa' of the fin structure 320a substantially equals the original width Wb of the fin structure 320b. In some embodiments, the original width Wa is different from the original width Wb by a first width, while the reduced width Wa' is different from the reduced width Wb' by a second width, and the second width is less than the first width. In some embodiments, the second width is negligible. In some embodiments, the second width substantially equals zero.

The proposed method provides advantages. The difference in fin widths due to the pattern loading effect (or etching loading effect) is reduced by selectively forming the protecting layer on the fin structures in different areas of the substrate. The selective forming of the protecting layer is achieved by performing the surface treatment targeting only the selected fin structures. The presence of the protecting layer may affect the oxidation rates with a predictable amount to offset the pattern loading effect. Accordingly, the variation of fin widths of the resulting fin structures may be reduced and the performance variation in FinFETs may be addressed.

The structures and methods of the present disclosure are not limited to the above-mentioned embodiments and may have other different embodiments. To simplify the description and for convenience of comparison between each of the embodiments of the present disclosure, identical (or like) components in each of the following embodiments are marked with identical (or like) numerals. For making it easier to compare differences between the embodiments, the following description will detail dissimilarities among different embodiments, while identical features, values and definitions will not be repeated.

FIG. 10B illustrates an alternative embodiment of formation of oxide layers. Referring to FIG. 10B, the oxidation operation 352 may introduce oxygen atoms toward the fin structures 320b in the second region 302b. The oxygen atoms may react with the atoms in the fin structures 320b, forming the oxide layers 350b-1 and 350b-2. A chemical formula of the oxide layers 350b-1 and 350b-2 may be $Si_xO_y$, wherein x and y are integers greater than zero.

In some embodiments, at least some of the oxygen atoms penetrate through the protecting layer 342 and reach the surface of the fin structure 320b. Hence, the oxide layer 350b-2 may be formed between the fin structure 320b and the protecting layer 342. In some embodiments, the oxide layer 350b-2 is formed during the forming of the oxide layer 350a and the oxide layer 350b-1. In some embodiments, a width Wn−2 of the oxide layer 350b-2 is less than a width Wn−1 of the oxide layer 350b-1. In alternative embodiments, the width Wn−2 of the oxide layer 350b-2 is greater than or equal to the width Wn−1 of the oxide layer 350b-1.

In some embodiments, the reduced width Wa' of the fin structure 320a substantially equals the reduced width Wb' of the fin structure 320b. In some embodiments, an overall width We of the fin structure 320a and the oxide layer 350a substantially equals an overall width Wd of the fin structure 320b, the protecting layer 342 and the oxide layers 350b-1 and 350b-2.

Figure 11:
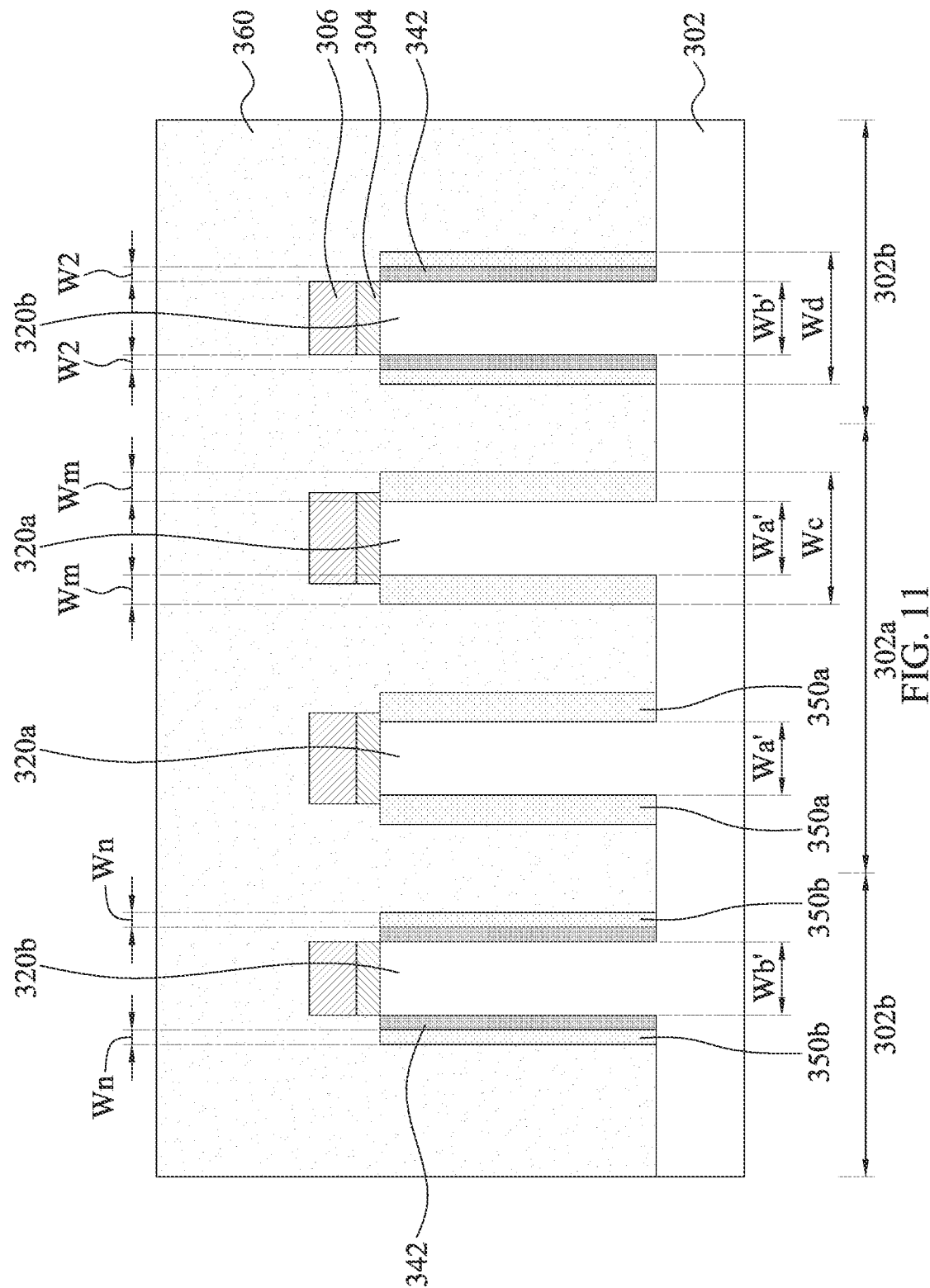

Referring to FIG. 11, following the operation described in FIG. 10A (or FIG. 10B), an isolation layer 360 is formed over the substrate 302. The isolation layer 360 includes dielectric materials, such as a thermal oxide. The isolation layer 360 is formed in the space between the fin structures 320a and 320b, and on the sidewalls of the oxide layers 350a and 350b. In some embodiments, the isolation layer 360 covers the fin structures 320a and 320b. The space between the fin structures 320a and 320b may be filled by the dielectric materials of the isolation layer 360 to a level higher than the top surfaces of mask layer 306. The formation method of the isolation layer 360 may be selected from chemical vapor deposition (CVD), ALD, flowable chemical vapor deposition (FCVD), high aspect-ratio process (HARP), high-density plasma CVD (HDPCVD), and the like.

Figure 12:
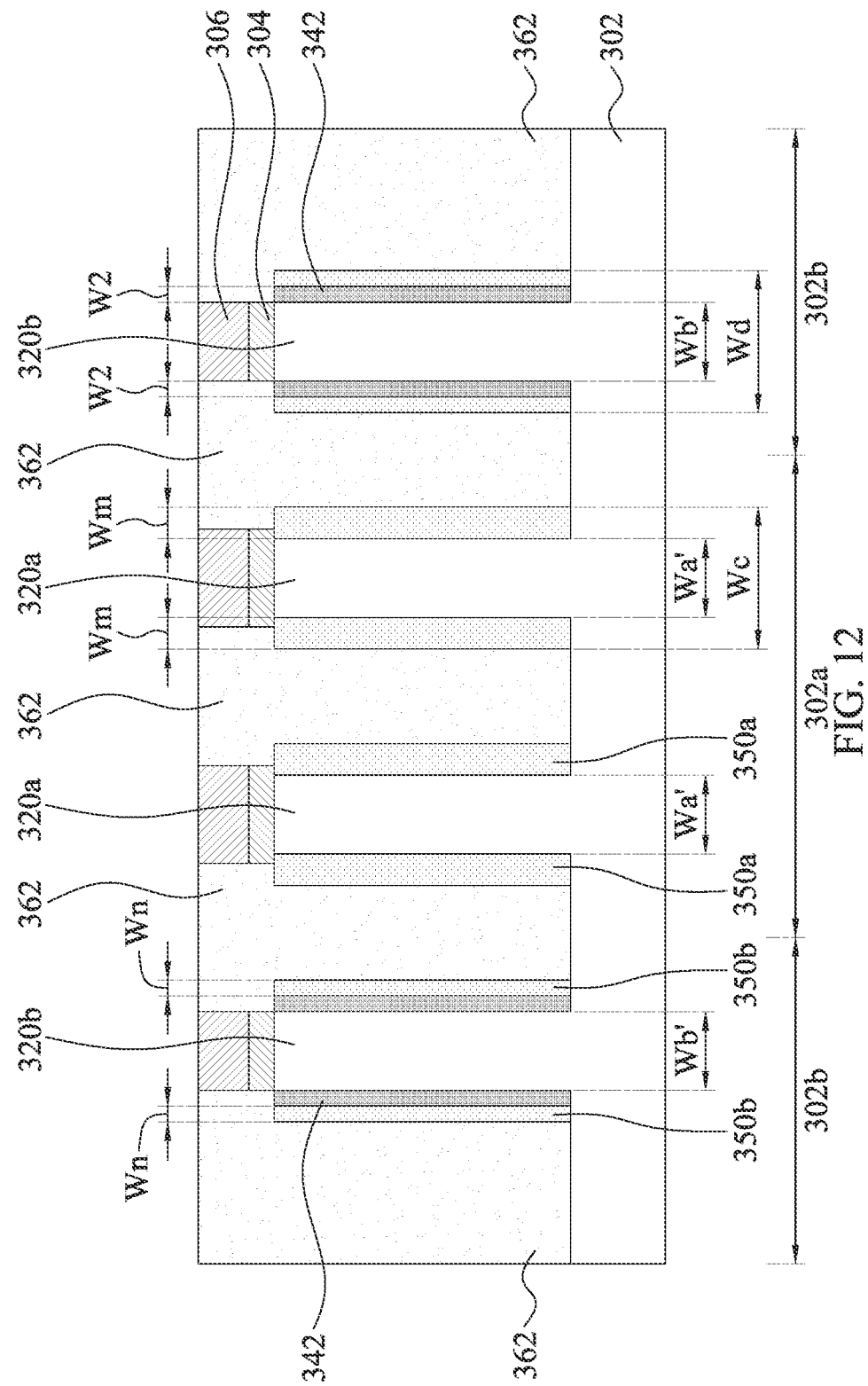

Referring to FIG. 12, a planarization operation such as a chemical mechanical polish (CMP) operation is then performed, and hence one or more isolation regions 362 are formed, which include the remaining portions of the isolation layer 360. During the planarization operation, the mask layer 306 is used as the CMP stop layer, and hence the top surface of mask layer 306 is substantially level with the top surfaces of isolation regions 362. In some embodiments, the isolation regions 362 are referred to as shallow trench isolation (STI) regions.

Figure 13:
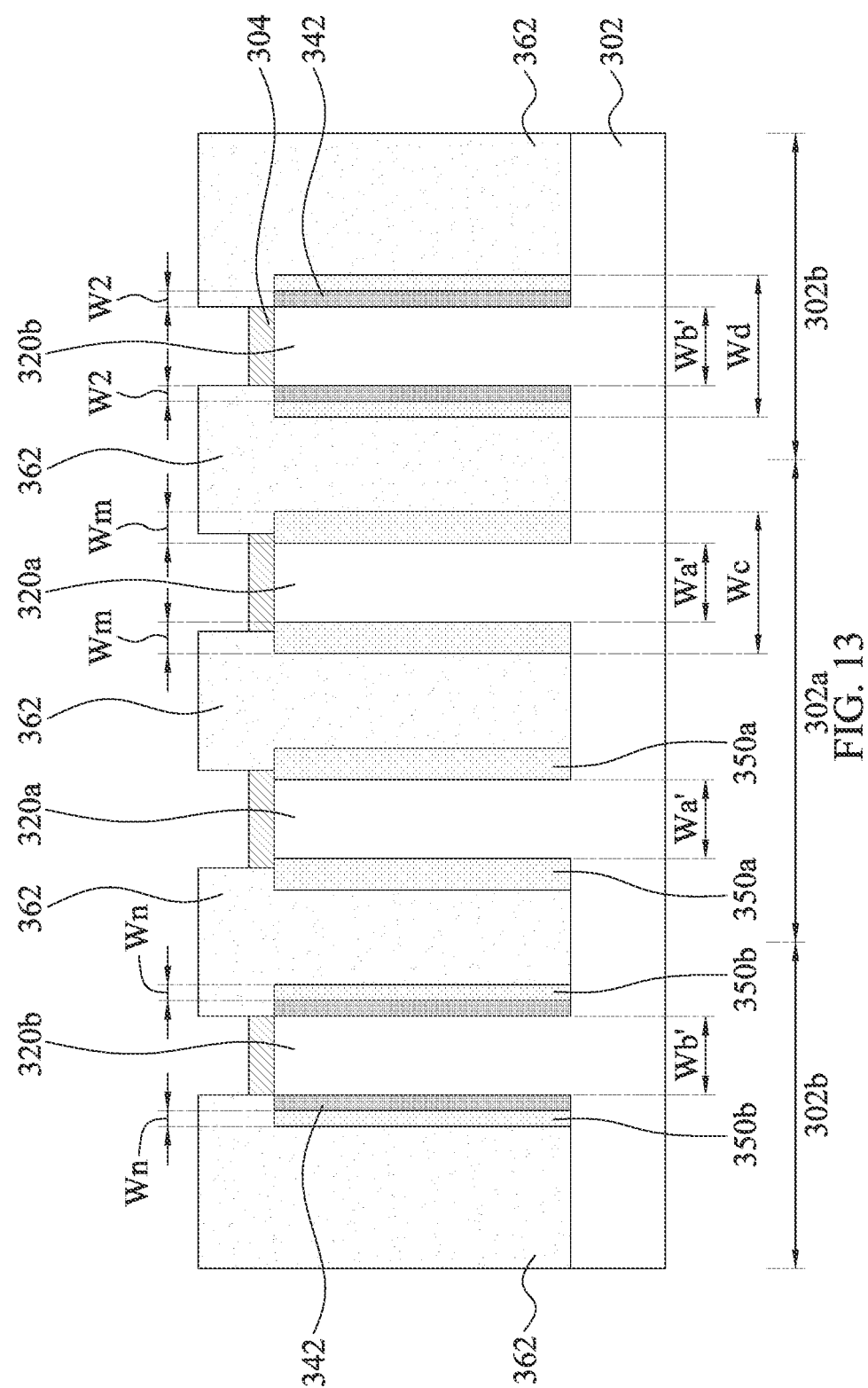

Referring to FIG. 13, the mask layer 306 is then removed. In some embodiments, the mask layer 306 is removed in a wet process. For example, the mask layer 306 may be removed by a phosphoric acid.

Figure 14:
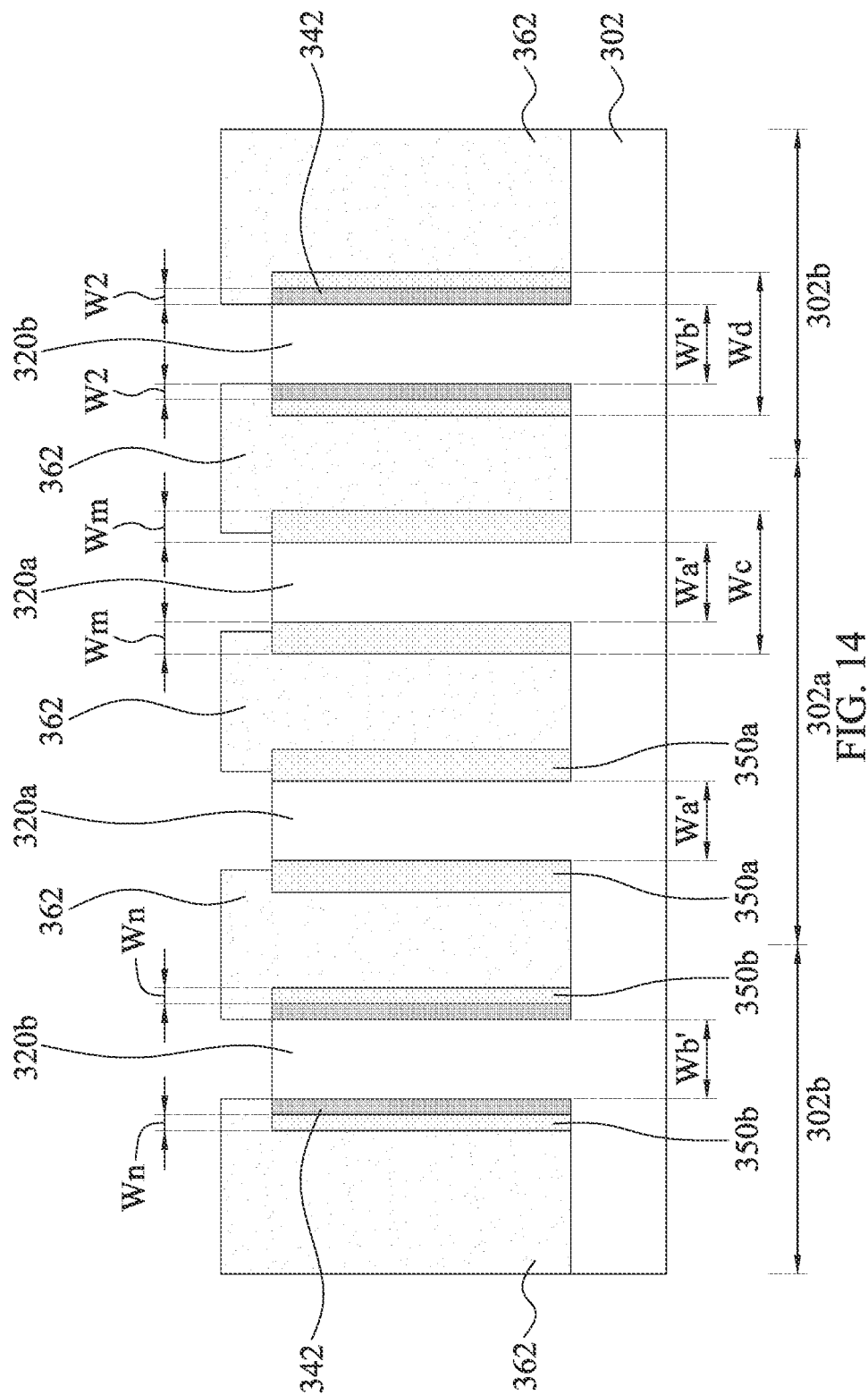

Referring to FIG. 14, the pad layer 304 is removed and the isolation regions 362 are etched. The isolation regions 362 and the pad layer 304 are etched to expose an upper surface of the fin structure 320a and an upper surface of the fin structure 320b. The removing of the pad layer 304 and the etching of isolation regions 362 may be performed using a dry etch operation or a wet etch operation.

Figure 15A:
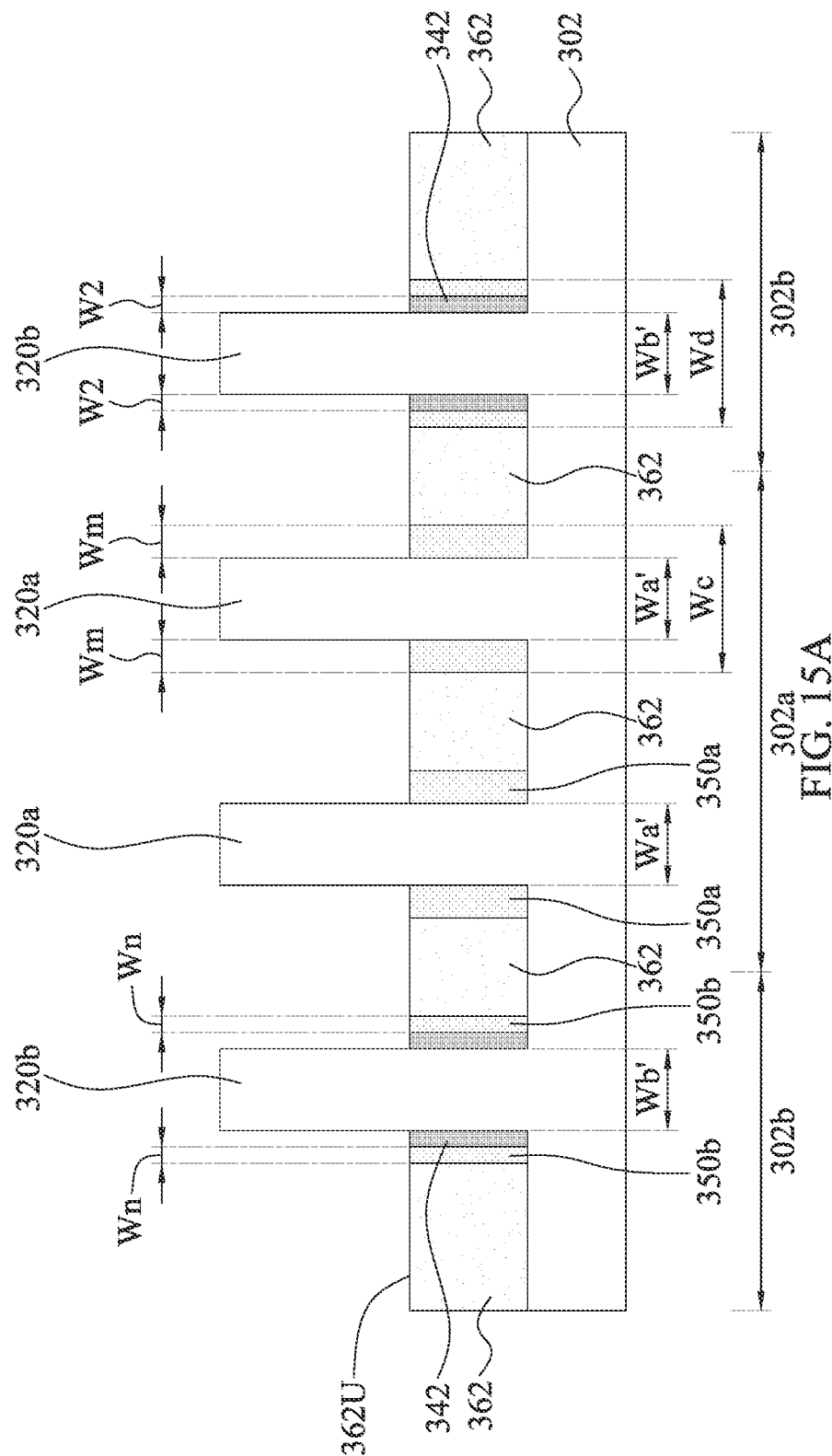
Figure 16:
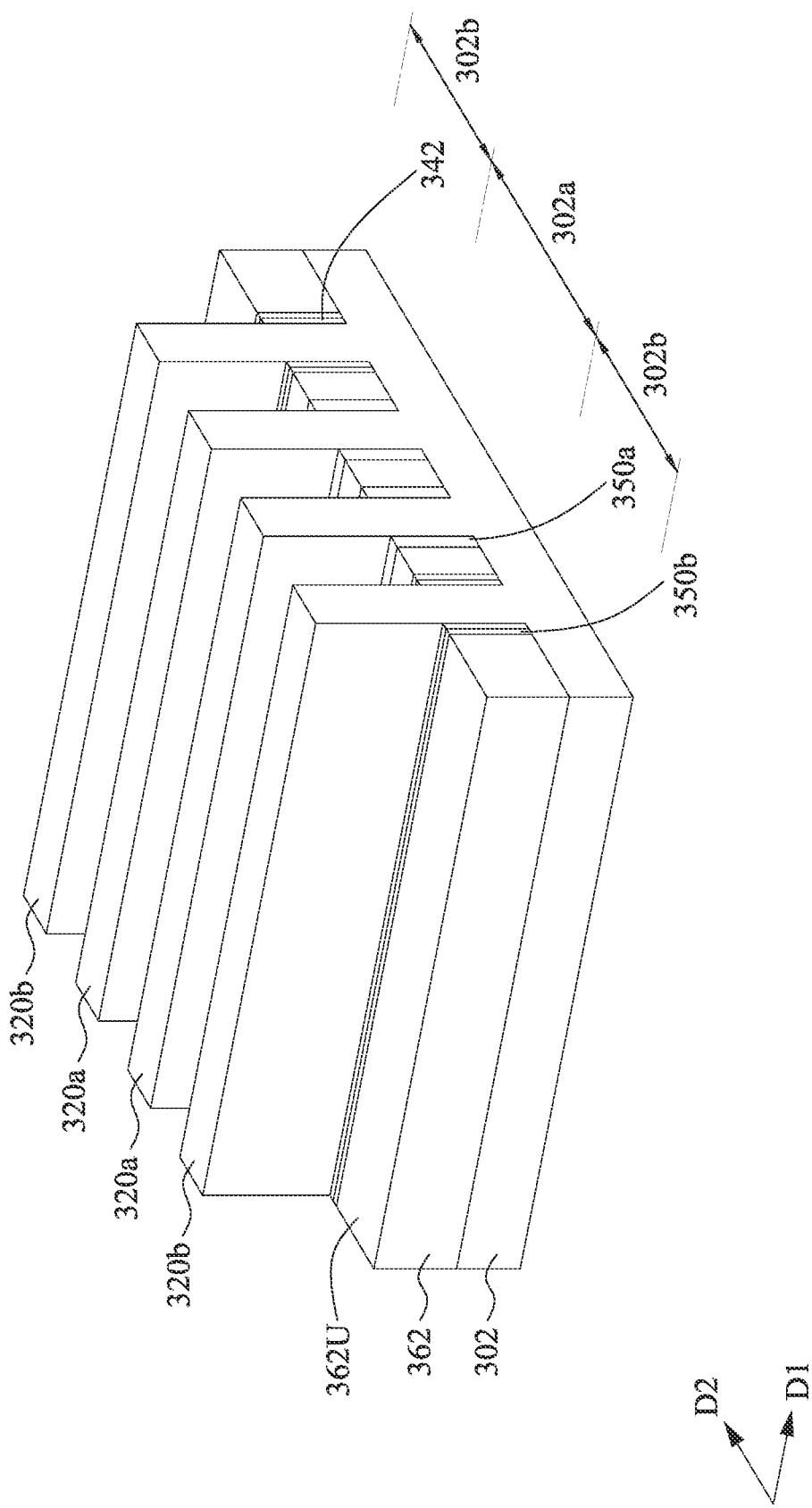
FIGS. 16 to 18 are schematic drawings illustrating a semiconductor structure at different fabrication stages constructed according to aspects of the present disclosure in one or more embodiments.
Figure 17:
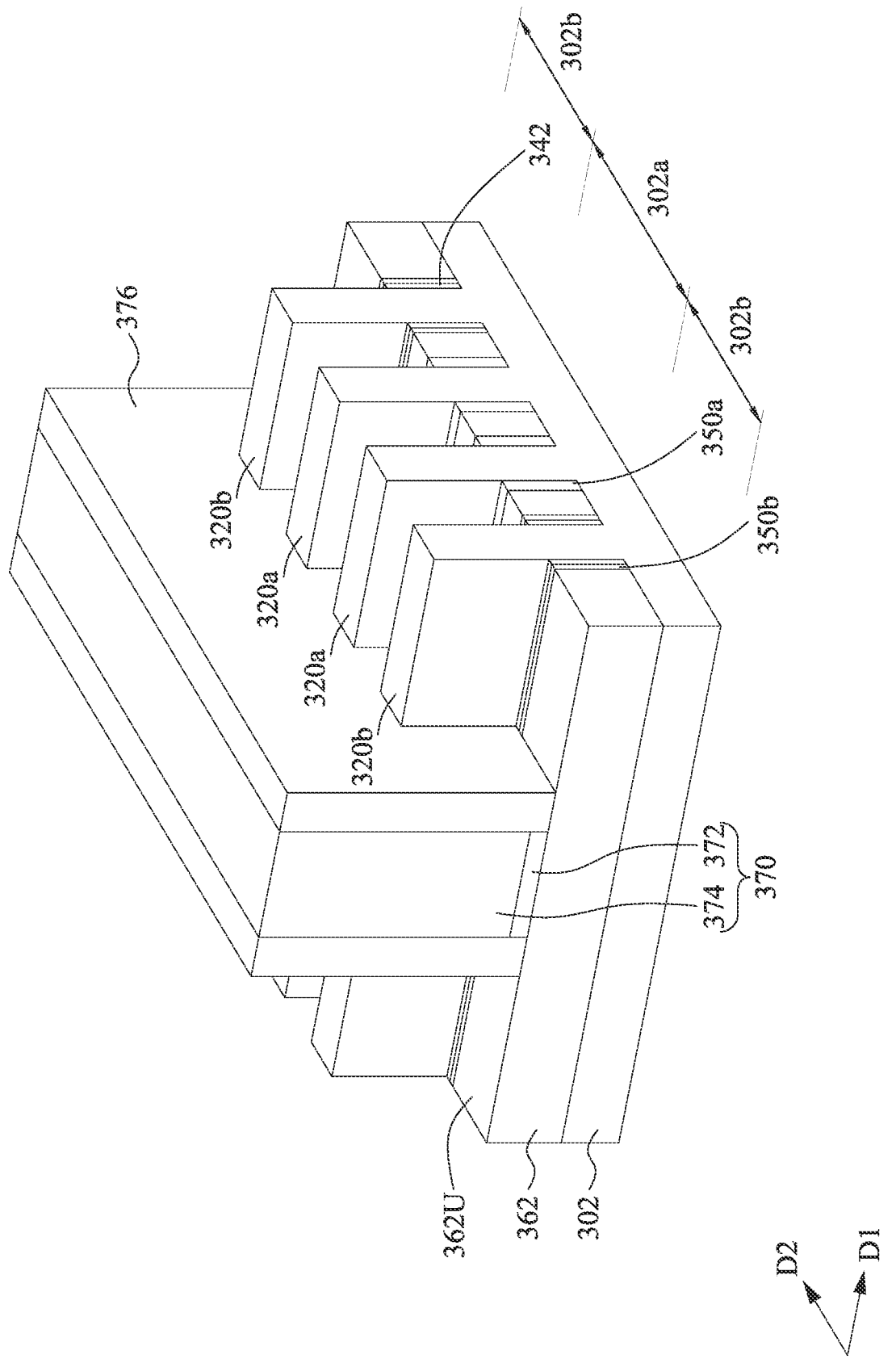

Referring to FIGS. 15A and 16, the isolation regions 362 are recessed. The portions of fin structures 320a and 320b protruding over the top surfaces 362U of the remaining isolation regions 362 may be regarded as semiconductor fins. The recessing (or etching) of the isolation regions 362 may be performed using a dry etch operation or a wet etch operation. In some embodiments, the recessing of isolation regions 362 is performed using a dry etch operation, in which the process gases are used. In alternative embodiments, the recessing of isolation regions 362 is performed using a wet etch operation, in which the etchant solutions are used. In some embodiments, the fin structures 320a and 320b extend along a first direction D1, as shown in FIG. 16.

In some embodiments, portions of the oxide layers 350a, 350b and the protecting layer 342 are removed during the recessing of the isolation regions 362. In some embodiments, the portions of the oxide layers 350a, 350b and the protecting layer 342 protruding over the top surfaces 362U of the resulting isolation regions 362 are completely removed.

Figure 15B:
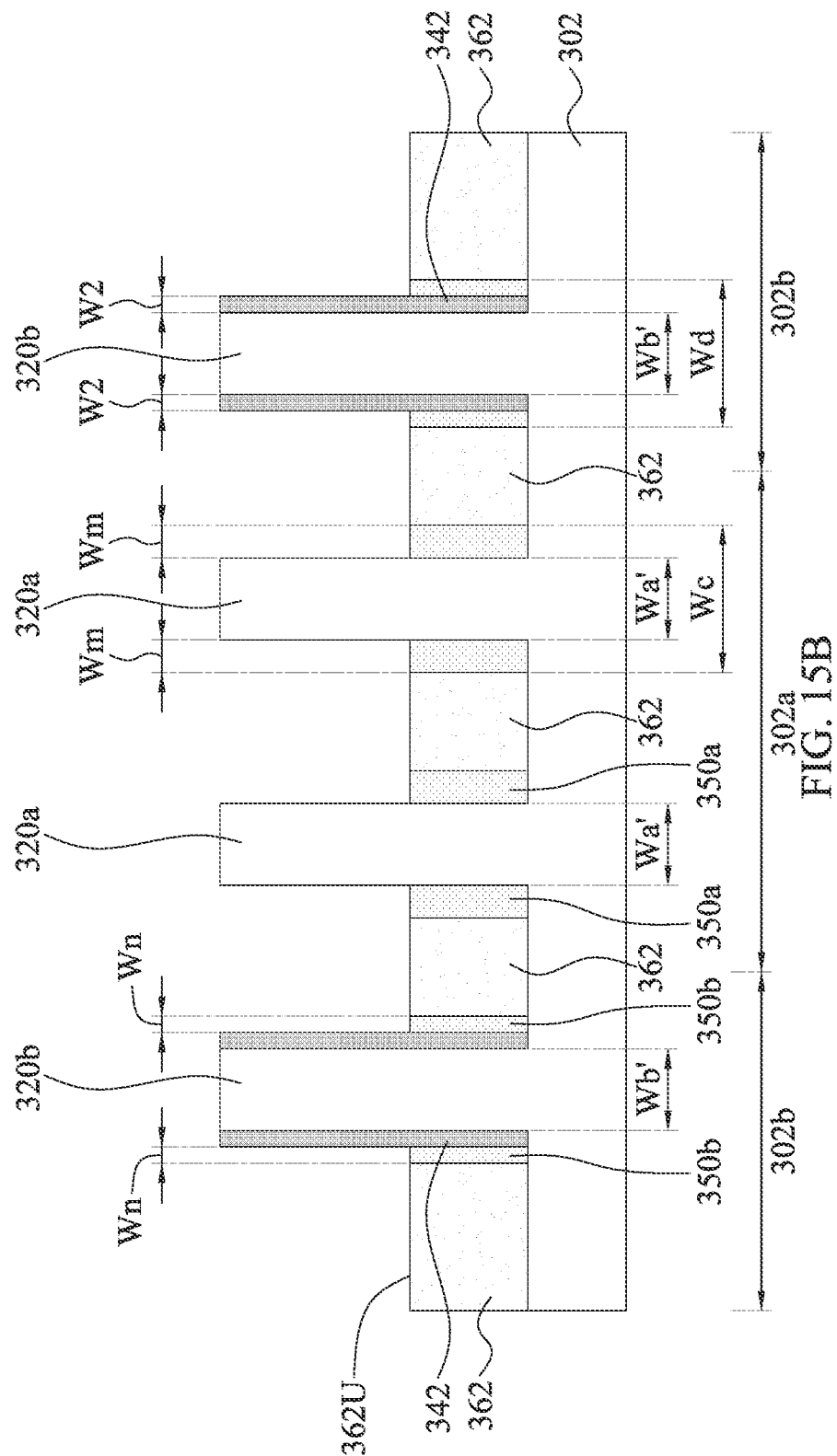

FIG. 15B illustrates an alternative embodiment of recessing of the isolation regions 362. In some embodiments, only the portions of the oxide layers 350a and 350b are removed during the recessing of the isolation regions 362. In some embodiments, the portions of the oxide layers 350a, 350b protruding over the top surfaces 362U of the resulting isolation regions 362 are completely removed, while the protecting layer 342 remains substantially intact after the recessing of the isolation regions 362.

Figure 15C:
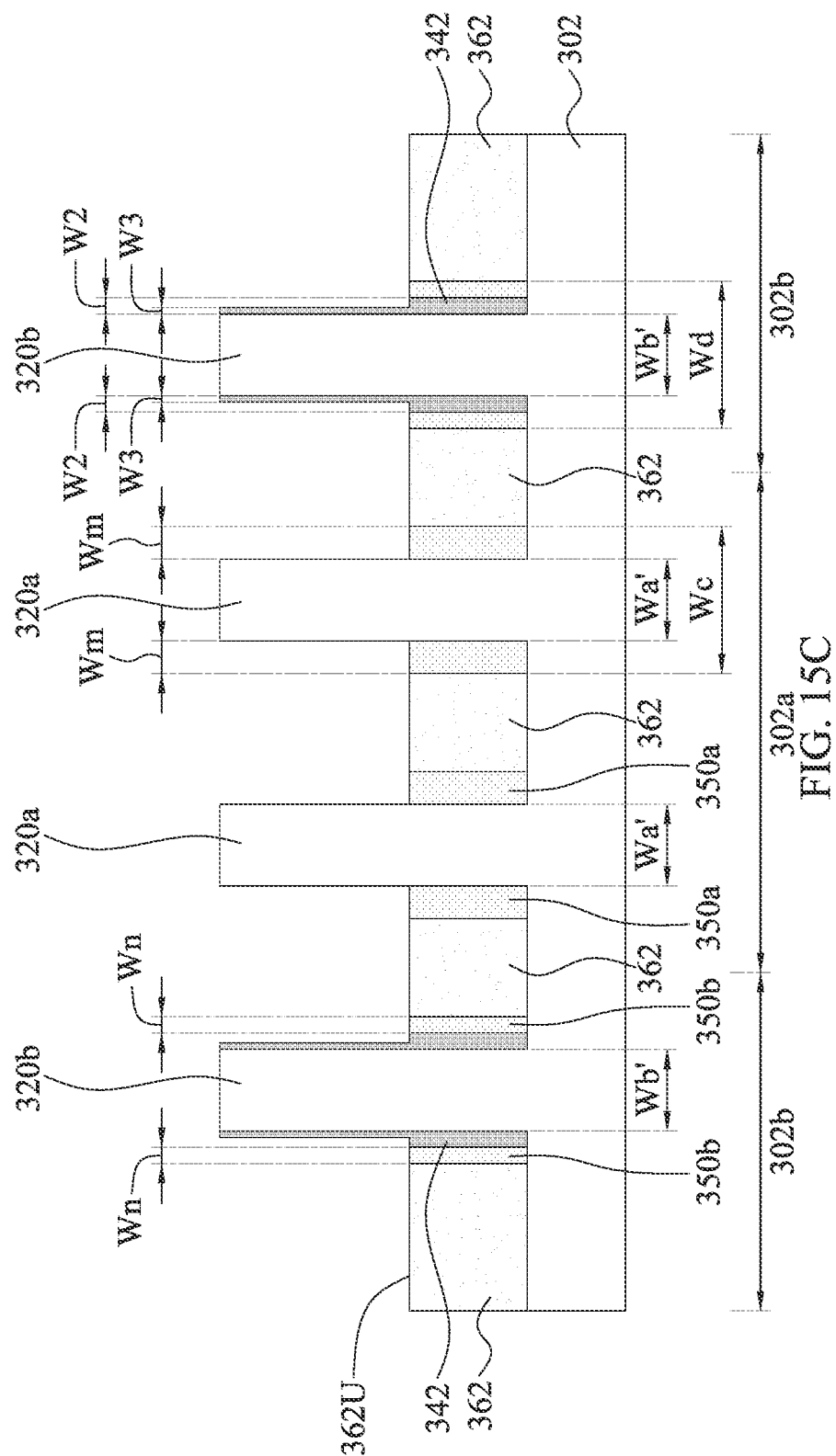

FIG. 15C illustrates another alternative embodiment of recessing of the isolation regions 362. In some embodiments, portions of the oxide layers 350a, 350b and the protecting layer 342 are removed during the recessing of the isolation regions 362. In some embodiments, the portions of the oxide layers 350a, 350b protruding over the top surfaces 362U of the resulting isolation regions 362 are completely removed, while the protecting layer 342 is partially removed during the recessing of the isolation regions 362. In other words, the protecting layer 342 may have a reduced width W3 protruding over the top surfaces 362U of the isolation regions 362.

Referring to FIG. 17, following the operation described in FIG. 15A (or FIG. 15B, 15C), a sacrificial gate structure 370 is formed over the fin structures 320a and 320b. The sacrificial gate structure 370 extends along a second direction D2 different from the first direction D1. The sacrificial gate structure 370 covers a portion of the fin structures 320a and 320b. In other words, the sacrificial gate structure 370 is at least partially disposed over the fin structures 320a and 320b, and portions of the fin structures 320a and 320b underlying the sacrificial gate structure 370 may be referred to as the channel region. The sacrificial gate structure 370 may also define source/drain regions of the fin structures 320a and 320b, for example, as portions of the fin structures 320a and 320b adjacent to and on opposing sides of the channel region.

The sacrificial gate structure 370 may include a dielectric layer 372 and a sacrificial gate layer 374. In some embodiments, the dielectric layer 372 includes silicon oxide, but the disclosure is not limited thereto. A thickness of the dielectric layer 372 may be between about 20 Å and about 50 Å, but the disclosure is not limited thereto. In some embodiments, the sacrificial gate layer 374 is made of polysilicon, but the disclosure is not limited thereto. Consequently, the dielectric layer 372 is sandwiched between the fin structures 320a, 320b and the sacrificial gate layer 374.

Spacers 376 are formed over sidewalls of the sacrificial gate structure 370. In some embodiments, the spacers 376 are made of silicon nitride, silicon carbide, silicon oxide, silicon oxynitride, silicon carbon or any suitable material, but the disclosure is not limited thereto. In some embodiments, the spacers 376 are formed by deposition and etching back operations.

Figure 18:
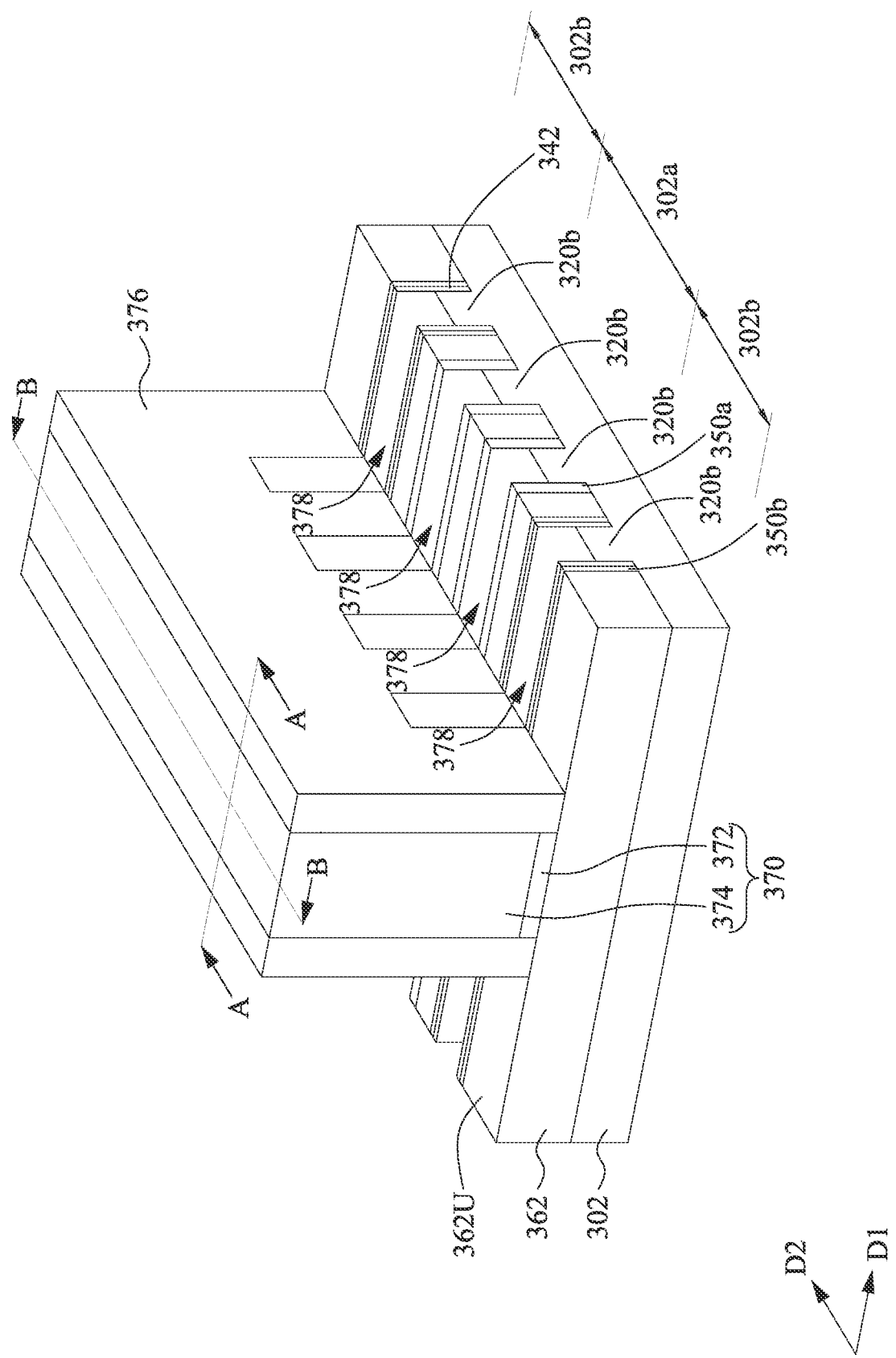
Figure 19:
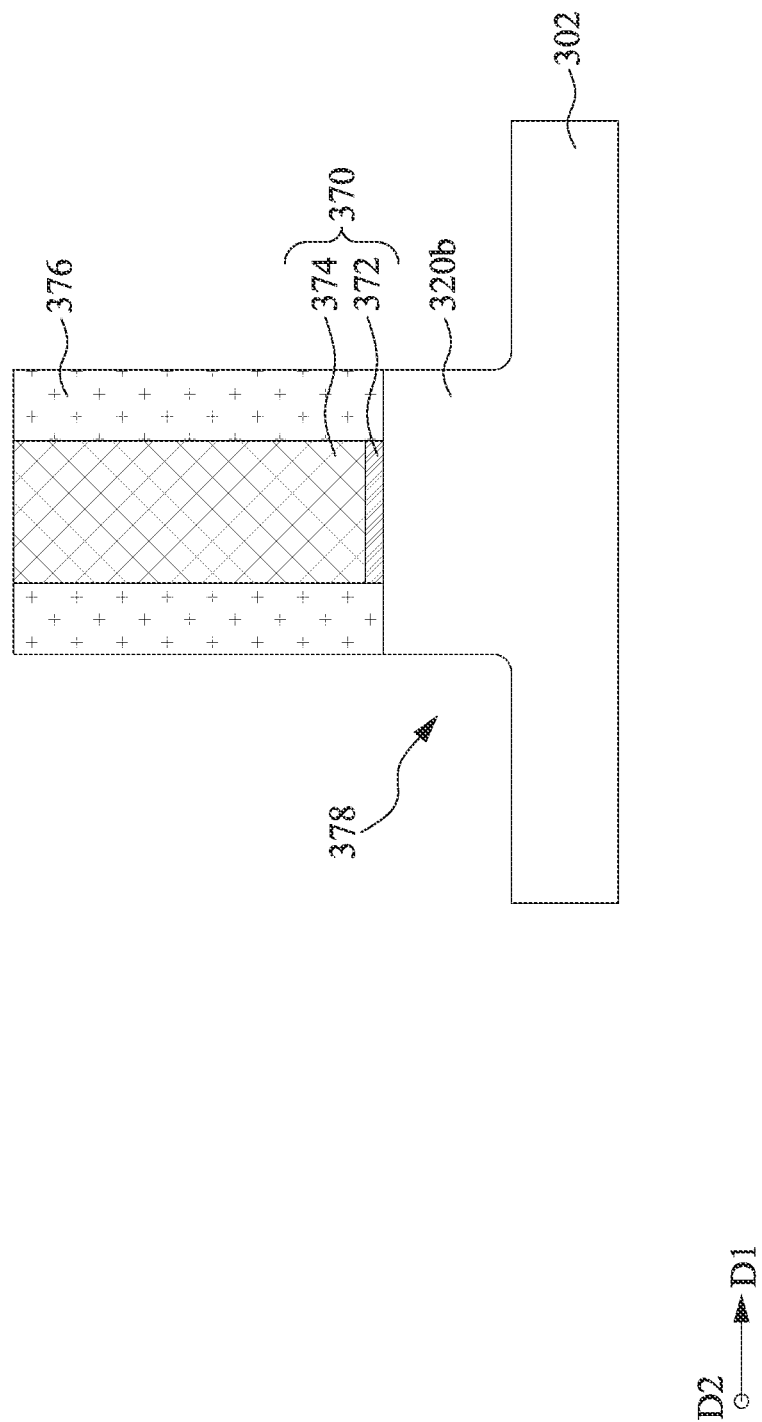
FIGS. 19 to 24C are cross-sectional views illustrating a semiconductor structure at different fabrication stages constructed according to aspects of one or more embodiments of the present disclosure.
Figure 23:
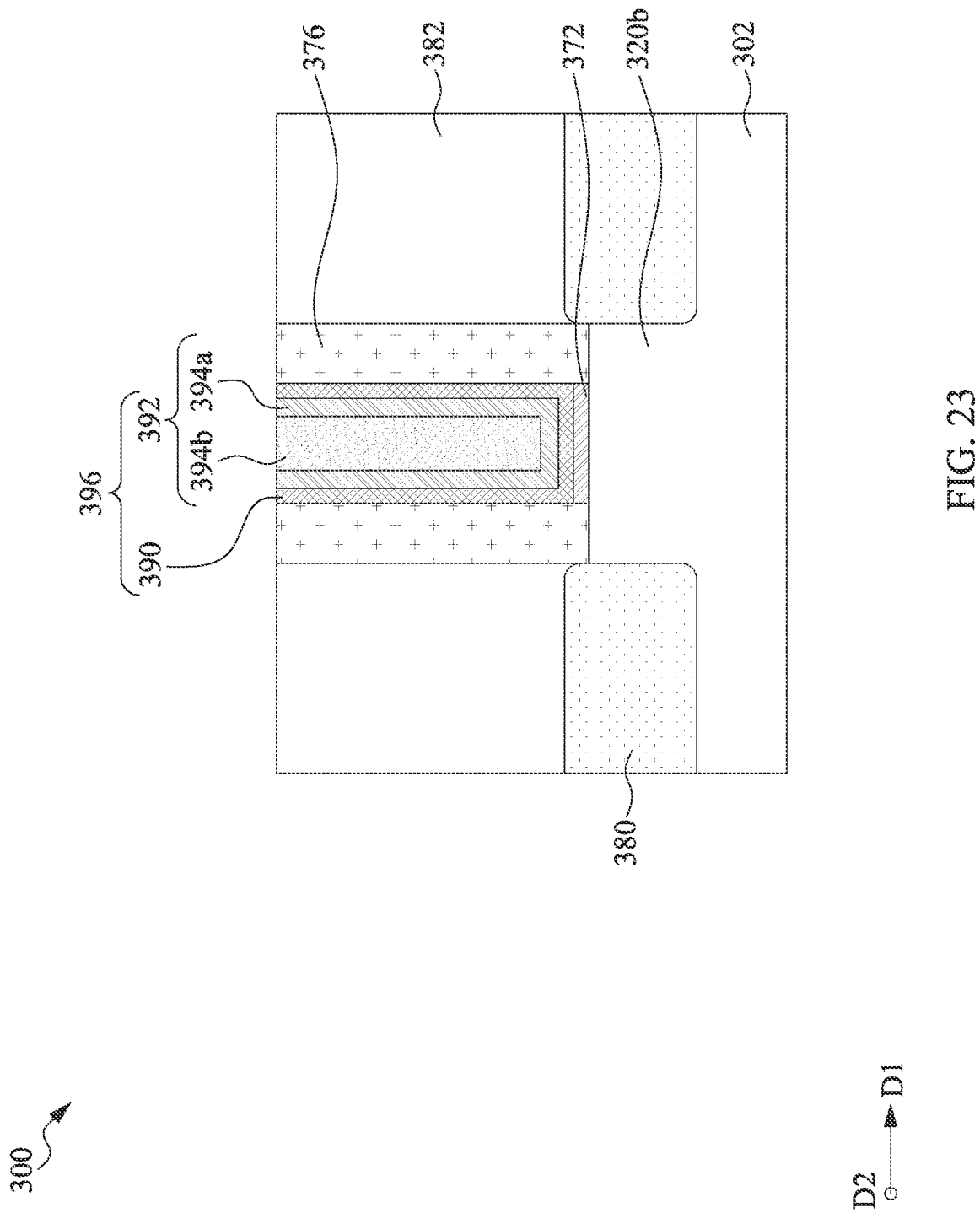
Figure 24A:
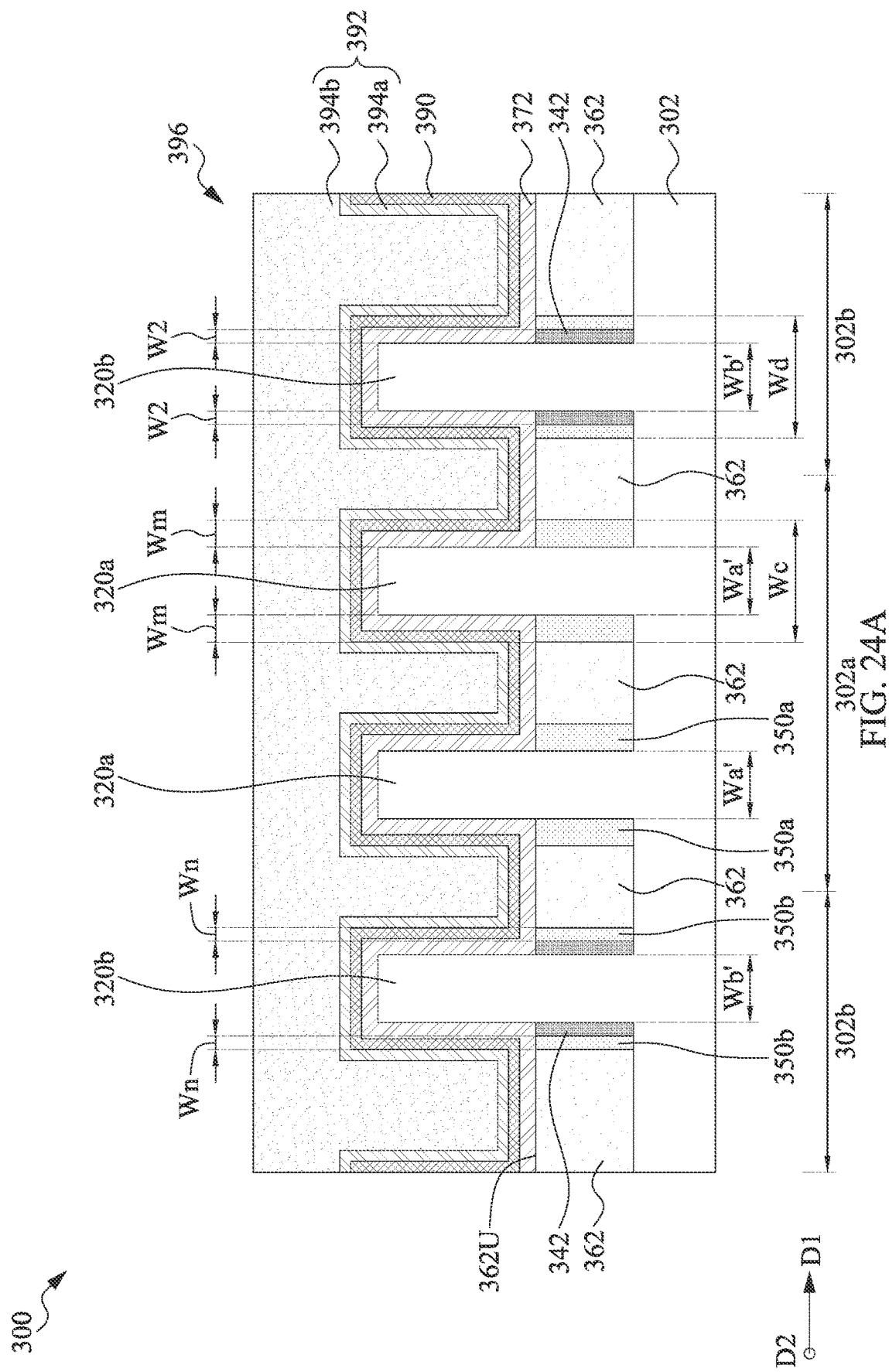
Figure 24B:
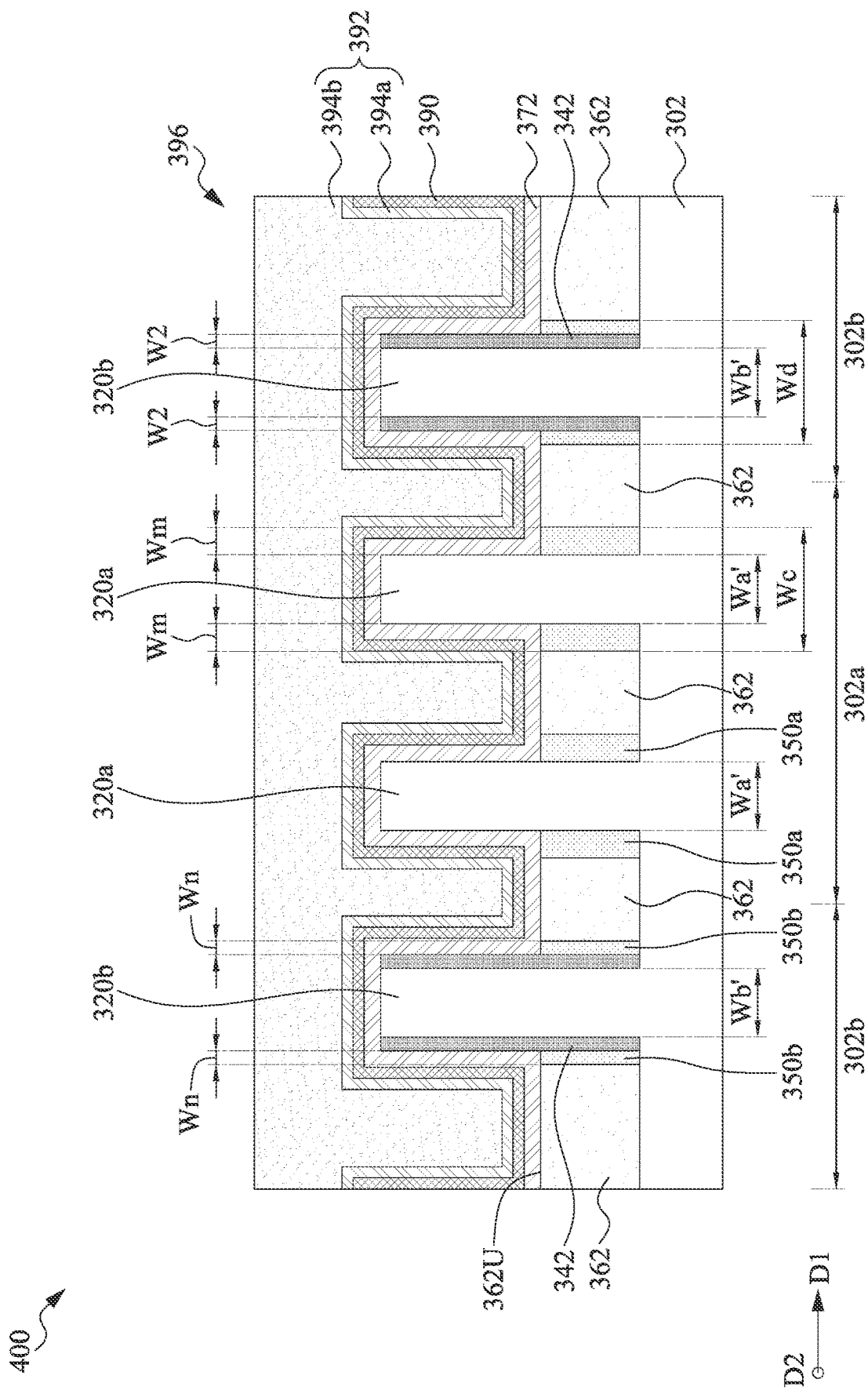
Figure 24C:
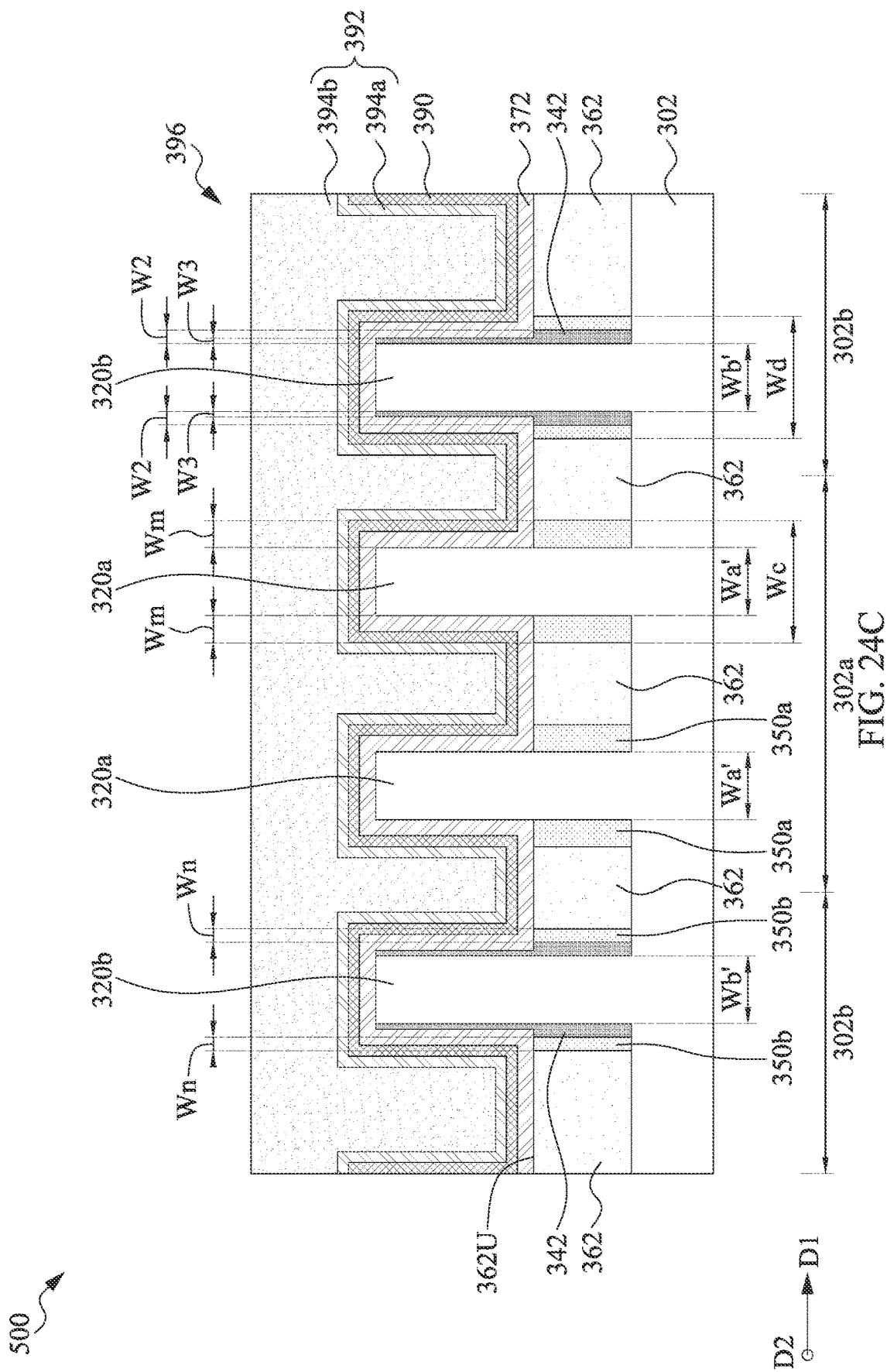

FIG. 18 is a schematic drawing illustrating a semiconductor structure at a fabrication stages constructed according to aspects of the present disclosure in one or more embodiments. FIG. 19 is a cross-sectional view taken along a line A-A of FIG. 18, and FIGS. 20, 21, 22 and 23 are cross-sectional views illustrating the semiconductor structure at different fabrication stages subsequent to FIG. 19. FIG. 24A to 24C are cross-sectional views (taken along a line similar as a line B-B of FIG. 18) illustrating the semiconductor structure at a same fabrication stage as FIG. 23.

Referring to FIGS. 18 and 19, recesses 378 are formed in the fin structures 320a and 320b on two sides of the sacrificial gate structure 370. The bottom surfaces of the recesses 378 may be higher than, equal to, or lower than the top surfaces 362U of the isolation regions 362.

Figure 20:
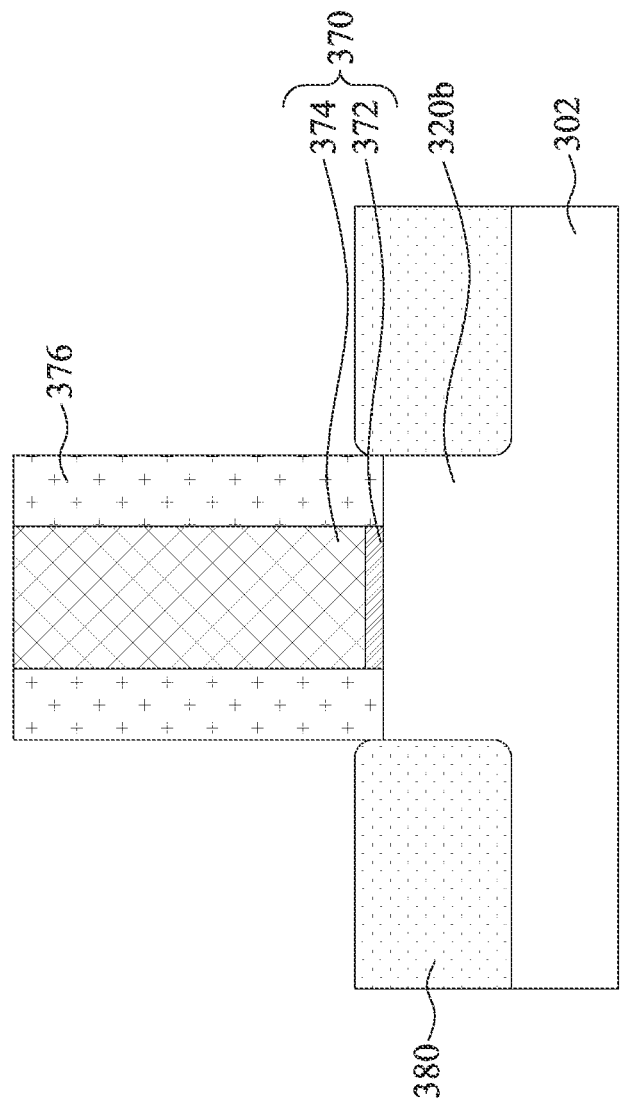

Referring to FIG. 20, a strained source/drain (S/D) structure 380 is formed in each of the recesses 378. In some embodiments, the strained S/D structures 380 are formed by growing a strained material in the recesses 378 by an epitaxial operation. In some embodiments, a lattice constant of the strained material may be different from a lattice constant of the substrate 302 and the fin structure 320b (or 320a). In some embodiments, the strained S/D structures 380 may include Ge, SiGe, InAs, InGaAs, InSb, GaSb, InAlP, InP, or a combination thereof, but the disclosure is not limited thereto.

Figure 21:
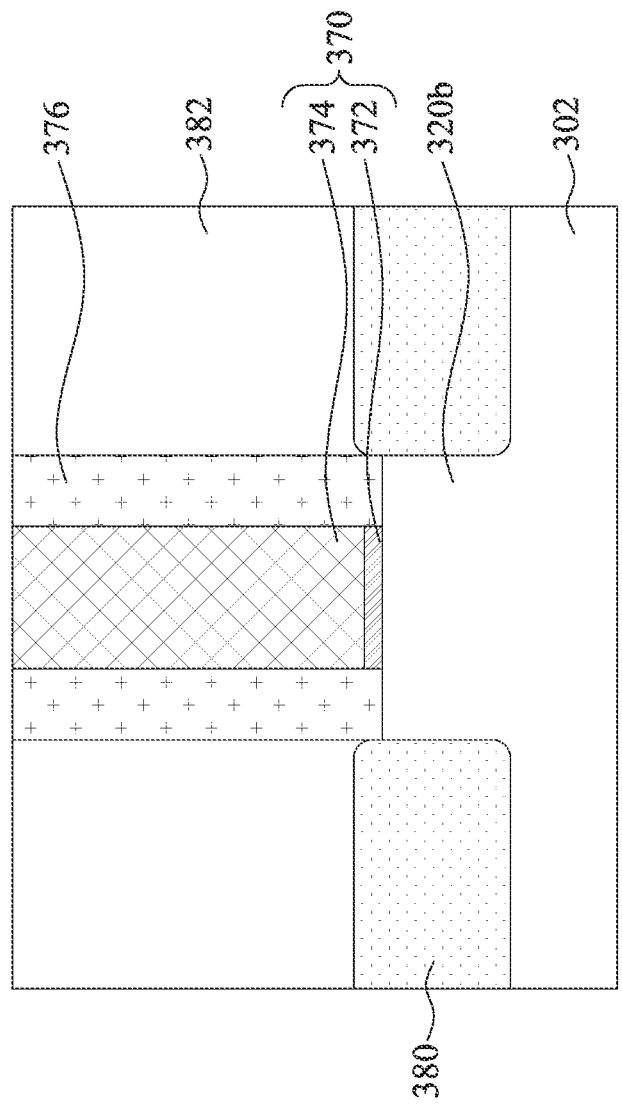

Referring to FIG. 21, a dielectric structure 382 is formed over the substrate 302. In some embodiments, the dielectric structure 382 includes an etch-stop layer (e.g., a contact etch stop layer (CESL)) (not shown) and various dielectric layers (e.g., an inter-layer dielectric (ILD) layer) formed over the substrate 302 after the forming of the strained S/D structures 380. In some embodiments, the CESL includes a SiN layer, a SiCN layer, a SiON layer, and/or other suitable materials. In some embodiments, the ILD layer includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after the CESL and the ILD layer are deposited, a planarization operation is performed to form the dielectric structure 382. Consequently, the dielectric structure 382 surrounds the sacrificial gate structure 370 and the fin structures 320$b$ (and 320$a$, not shown). In other words, the fin structures 320$b$ and the sacrificial gate structure 370 are embedded in the dielectric structure 382, while a top surface of the sacrificial gate structure 370 remains exposed.

Figure 22:
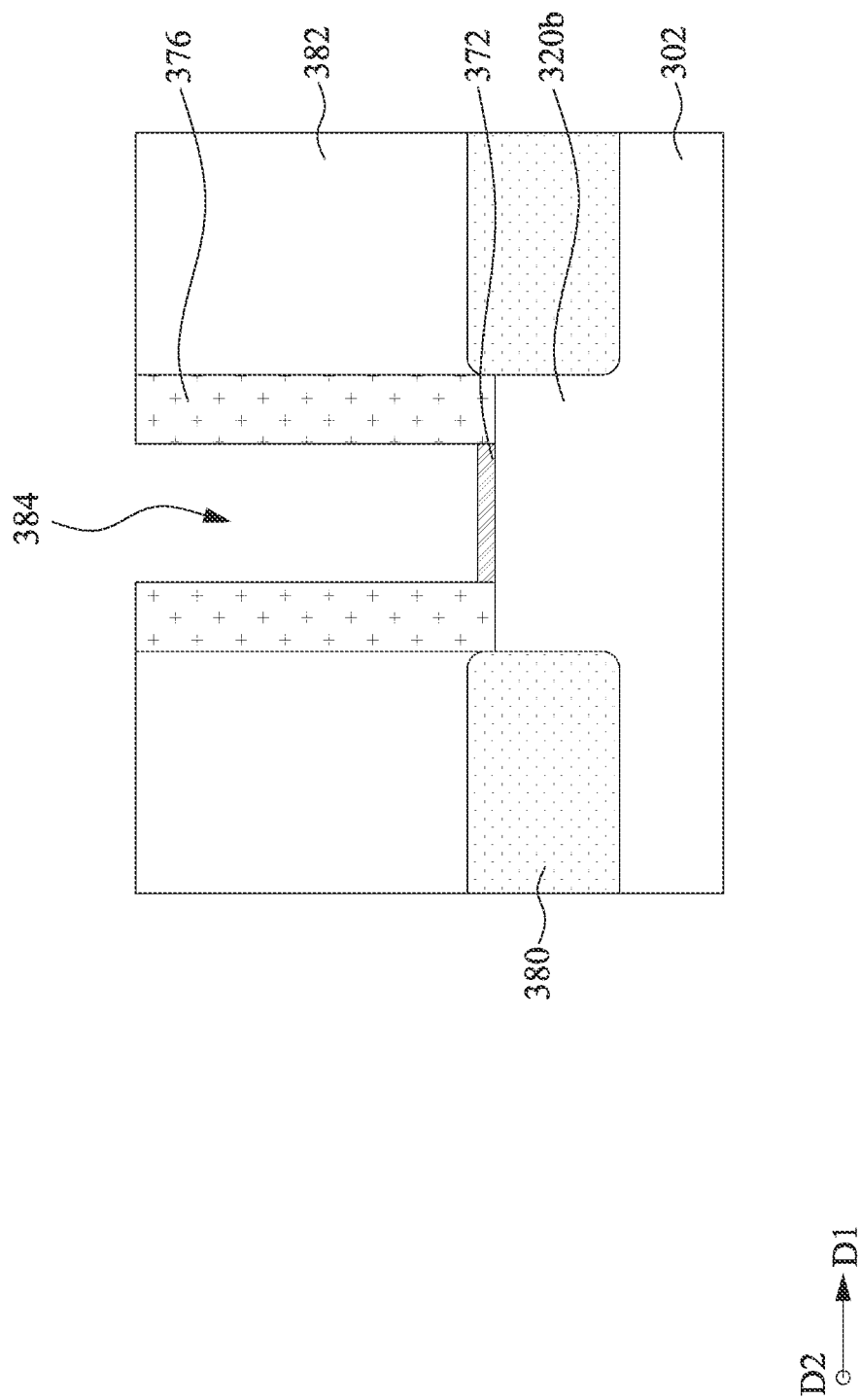

Referring to FIG. 22, the sacrificial gate layer 374 is removed to form a gate trench 384 in the dielectric structure 382. The sacrificial gate layer 374 may be removed by a dry etching operation or a wet etching operation. Furthermore, the dielectric layer 372 is exposed to the gate trench 384. In some embodiments, the dielectric layer 372 remains substantially intact after the removing of the sacrificial gate layer 374.

It should be understood that the substrate 302 may include various device regions, and the various device regions may include various n-type and p-type FET devices. It should be also understood that different devices may require different elements.

In some embodiments, when an I/O FET device is required, the dielectric layer 372 may serve as an interfacial layer (IL). FIGS. 23 and 24A illustrates an embodiment of a FET device 300. Referring to FIGS. 23 and 24A, a gate structure 396 including a gate dielectric layer 390 and a metal gate electrode 392 is formed in the gate trench 384. The gate structure 396 extends over the fin structures 320$a$ and 320$b$. The gate dielectric layer 390 and the metal gate electrode 392 are formed over the dielectric layer 372. The metal gate electrode 392 is formed on the gate dielectric layer 390.

In some embodiments, the gate dielectric layer 390 includes a high-k dielectric material having a high dielectric constant, for example, greater than that of thermal silicon oxide (~3.9). The high-k dielectric material may include hafnium oxide (HfO$_2$), zirconium oxide (ZrO$_2$), lanthanum oxide (La$_2$O$_3$), aluminum oxide (Al$_2$O$_3$), titanium oxide (TiO$_2$), yttrium oxide (Y$_2$O$_3$), strontium titanate (SrTiO$_3$), hafnium oxynitride (HfO$_x$N$_y$), other suitable metal-oxides, or combinations thereof. In some embodiments, the metal gate electrode 392 includes at least a barrier metal layer (not shown), a work functional metal layer 394$a$ and a gap-filling metal layer 394$b$. The barrier metal layer may include, for example but not limited to, TiN. The work function metal layer 394$a$ may include a single layer of TiN, TaN, TaAlC, TiC, TaC, Co, Al, TiAl, Hffi, TiSi, TaSi or TiAlC, or a multilayer of two or more of these materials, but is not limited to the above-mentioned materials. In some embodiments, the gap-filling metal layer 394$b$ includes conductive material such as Al, Cu, AlCu, or W, but is not limited to the above-mentioned materials.

In alternative embodiments, when a core FET device is required, the dielectric layer 372 is removed to expose the fin structure 320$b$ (or 320$a$) to the gate trench 384. In such embodiments, an interfacial layer (not shown) is formed in the gate trench 384 prior to the forming of the gate dielectric layer 390 and the metal gate electrode 392. In some embodiments, the interfacial layer includes an oxide-containing material such as SiO or SiON.

FIG. 24B illustrates an alternative embodiment of a FET device 400. In some embodiments, following the operation described in FIG. 15B, the gate dielectric layer 390 is formed lining along the protecting layer 342. In some embodiments, the protecting layer 342 has a uniform width W2 lining along the fin structure 320$b$. In some embodiments, the gate dielectric layer 390 and the portion of the protecting layer 342 protruding over the top surfaces 362U of the isolation regions 362 are collectively regarded as a gate dielectric structure of the gate structure 396. The presence of the protecting layer 342 may slightly change the turn-on voltage of the FET device 400, however, such change could be negligible.

FIG. 24C illustrates another alternative embodiment of a FET device 500. In some embodiments, following the operation described in FIG. 15C, the gate dielectric layer 390 is formed lining along the protecting layer 342. In some embodiments, the gate dielectric layer 390 lines along the portion of the protecting layer 342 having the reduced width W3. In some embodiments, the gate dielectric layer 390 and the portion of the protecting layer 342 having the reduced width W3 are collectively regarded as a gate dielectric structure of the gate structure 396. The presence of the protecting layer 342 may slightly change the turn-on voltage of the FET device 500, however, such change could be negligible.

In accordance with some embodiments of the present disclosure, a method is provided. The method includes the following operations. A substrate is received. The substrate includes a first region and a second region adjacent to the first region. The substrate is patterned to form a first fin structure in the first region and a pair of second fin structures in the second region, wherein the first fin structure is between the pair of second fin structures, and a first width of the first fin structure is greater than a second width of each of the pair of second fin structures. A protecting layer is formed on each of the pair of second fin structures. A first oxide layer is formed over the first fin structure and a second oxide layer is formed over the protecting layer, wherein a width of the first oxide layer is greater than a width of the second oxide layer.

In accordance with some embodiments of the present disclosure, a method is provided. The method includes the following operations. A substrate is received. The substrate includes a central region and a peripheral region. A plurality of first fin structures is formed in the central region and a second fin structure is formed in the peripheral region, wherein a first width of each of the plurality of first fin structures is different from a second width of the second fin structure by a third width. A surface treatment is performed on the second fin structure. An oxidation operation is performed over the plurality of first fin structures and the second fin structure, wherein through the oxidation operation, each of the plurality of first fin structures has a first reduced width and the second fin structure has a second reduced width, and the first reduced width is different from the second reduced width by a fourth width less than the third width.

In accordance with some embodiments of the present disclosure, a semiconductor structure is provided. The semiconductor structure includes a substrate, a first fin structure, a second fin structure, a first oxide layer, a second oxide layer and a protecting layer. The substrate includes a central region and a peripheral region. The first fin structure is disposed in the central region and the second fin structure is disposed in the peripheral region. The second fin structure is immediately adjacent to the first fin structure. The first oxide layer is disposed on the first fin structure. The protecting layer is disposed over the second fin structure. The second oxide layer is disposed over the protecting layer. A width of the first oxide layer is greater than a width of the second oxide layer. A gate structure extends over the first fin structure and the second fin structure.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a substrate including a first region and a second region adjacent to the first region;
   patterning the substrate to form a first fin structure in the first region and a pair of second fin structures in the second region, wherein the first fin structure is between the pair of second fin structures, and a first width of the first fin structure is greater than a second width of each of the pair of second fin structures;
   forming a protecting layer on each of the pair of second fin structures; and
   forming a first oxide layer over the first fin structure and forming a second oxide layer over the protecting layer, wherein a width of the first oxide layer is greater than a width of the second oxide layer,
   wherein an overall width of the first fin structure and the first oxide layer substantially equals an overall width of one of the pair of second fin structures, the protecting layer and the second oxide layer.

2. The method of claim 1, wherein the forming of the protecting layer comprises performing a surface treatment over the pair of second fin structures.

3. The method of claim 2, wherein the surface treatment comprises nitridation on a surface of each of the pair of second fin structures.

4. The method of claim 1, wherein the protecting layer is formed by implantation, thermal diffusion, atomic layer deposition or wet diffusion.

5. The method of claim 1, wherein the forming of the first oxide layer and the second oxide layer comprises performing an oxidation operation over the first fin structure and the pair of second fin structures.

6. The method of claim 1, further comprising:
   forming a third oxide layer between the protecting layer and each of the pair of second fin structures.

7. The method of claim 6, wherein the third oxide layer is formed during the forming of the first oxide layer and the second oxide layer.

8. The method of claim 1, wherein the protecting layer is conformal to each of the pair of second fin structures.

9. The method of claim 8, wherein a width of the protecting layer is between about 1 Å and about 30 Å.

10. The method of claim 1, wherein during the forming of the second oxide layer, the protecting layer at least partially blocks oxygen atoms from reaching the pair of second fin structures.

11. A method, comprising:
    receiving a substrate including a central region and a peripheral region;
    forming a plurality of first fin structures in the central region and a second fin structure in the peripheral region, wherein a first width of each of the plurality of first fin structures is different from a second width of the second fin structure by a third width;
    performing a surface treatment on the second fin structure; and
    performing an oxidation operation over the plurality of first fin structures and the second fin structure, wherein through the oxidation operation, each of the plurality of first fin structures has a first reduced width and the second fin structure has a second reduced width, and the first reduced width is different from the second reduced width by a fourth width less than the third width.

12. The method of claim 11, wherein the oxidation operation forms a first oxide layer on each of the plurality of first fin structures and a second oxide layer on the second fin structure, wherein a width of the first oxide layer is greater than a width of the second oxide layer.

13. The method of claim 11, wherein the surface treatment comprises forming a protecting layer on the second fin structure.

14. The method of claim 13, wherein the oxidation operation comprises:
    introducing a plurality of oxygen atoms toward the plurality of first fin structures and the second fin structure, wherein the protecting layer at least partially blocks the plurality of oxygen atoms from reaching the second fin structure.

15. The method of claim 11, further comprising:
    forming an isolation layer over the substrate, wherein the isolation layer covers the plurality of first fin structures and the second fin structure.

16. The method of claim 15, further comprising:
    etching the isolation layer to expose an upper surface of each of the plurality of first fin structures and an upper surface of the second fin structure.

17. The method of claim 11, further comprising:
    forming a patterned mask covering the plurality of first fin structures and exposing the second fin structure prior to the performing of the surface treatment.

18. A semiconductor structure, comprising:
    a substrate including a central region and a peripheral region;
    a first fin structure in the central region and a second fin structure in the peripheral region, wherein the second fin structure is immediately adjacent to the first fin structure;
    a first oxide layer on the first fin structure;
    a protecting layer over the second fin structure; and
    a second oxide layer over the protecting layer, wherein a width of the first oxide layer is greater than a width of the second oxide layer; and
    a gate structure extending over the first fin structure and the second fin structure,
    wherein an overall width of the first fin structure and the first oxide layer substantially equals an overall width of the second fin structure, the protecting layer and the second oxide layer.

19. The semiconductor structure of claim 18, wherein the protecting layer is between the second oxide layer and the second fin structure.

20. The semiconductor structure of claim 18, wherein the protecting layer comprises implants of at least one of nitrogen, boron, carbon, phosphorus, gallium, germanium, arsenic, indium, and antimony.

* * * * *